(12) United States Patent
Howald et al.

(10) Patent No.: US 11,929,235 B2
(45) Date of Patent: Mar. 12, 2024

(54) SYSTEMS AND METHODS FOR TUNING A MHZ RF GENERATOR WITHIN A CYCLE OF OPERATION OF A KHZ RF GENERATOR

(71) Applicant: Lam Research Corporation, Fremont, CA (US)

(72) Inventors: Arthur M. Howald, Livermore, CA (US); John C. Valcore, Jr., Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 276 days.

(21) Appl. No.: 17/616,987

(22) PCT Filed: May 6, 2020

(86) PCT No.: PCT/US2020/031723
§ 371 (c)(1),
(2) Date: Dec. 6, 2021

(87) PCT Pub. No.: WO2020/247138
PCT Pub. Date: Dec. 10, 2020

(65) Prior Publication Data
US 2022/0165543 A1  May 26, 2022

Related U.S. Application Data

(60) Provisional application No. 62/858,538, filed on Jun. 7, 2019.

(51) Int. Cl.
*H01J 37/32* (2006.01)

(52) U.S. Cl.
CPC .. *H01J 37/32155* (2013.01); *H01J 37/32183* (2013.01)

(58) Field of Classification Search
CPC ........... H01J 37/32155; H01J 37/32183; H01J 37/32174; H01J 37/32926
See application file for complete search history.

(56) References Cited

U.S. PATENT DOCUMENTS

| 6,958,630 | B2 | 10/2005 | Watanabe et al. |
| 7,967,944 | B2 | 6/2011 | Shannon et al. |
| 2015/0122421 | A1 | 5/2015 | Komo et al. |
| 2016/0079037 | A1 | 3/2016 | Hirano et al. |
| 2016/0307736 | A1* | 10/2016 | Howald ............ H01J 37/32183 |
| 2017/0062187 | A1* | 3/2017 | Radomski ............. H01J 37/321 |

OTHER PUBLICATIONS

ISR & Written Opinion PCT/US2020/031723, dated Aug. 21, 2020, 13 pages.

* cited by examiner

*Primary Examiner* — Raymond R Chai
(74) *Attorney, Agent, or Firm* — PENILLA IP, APC

(57) ABSTRACT

Systems and methods for tuning a megahertz radio frequency (RF) generator within a cycle of operation of a kilohertz (kHz) RF generator are described. In one of the methods, a predetermined periodic waveform is provided to a processor. The processor uses a computer-based model to determine plurality of frequency parameters for the predetermined periodic waveform. The frequency parameters are applied to the megahertz RF generator to generate an RF signal having the frequency parameters during one or more cycles of operation of the kilohertz RF generator.

32 Claims, 24 Drawing Sheets

(During processing)

| X kHz | t (μs) | Γ (complex) |
|---|---|---|
| 1 cycle (See Fig. 2A) | 0.1 | Γ11 |
| | 0.2 | Γ21 |
| | 0.3 | Γ31 |
| | • | • |
| | • | • |
| | • | • |
| | 0.n | Γn1 |

Can be calculated from complex V & I for Y MHz (see Fig. 2D & Fig. 2E)

Could be average over 10 cycles of X kHz 130 (By Computer)

FIG. 1B-1
(During processing)

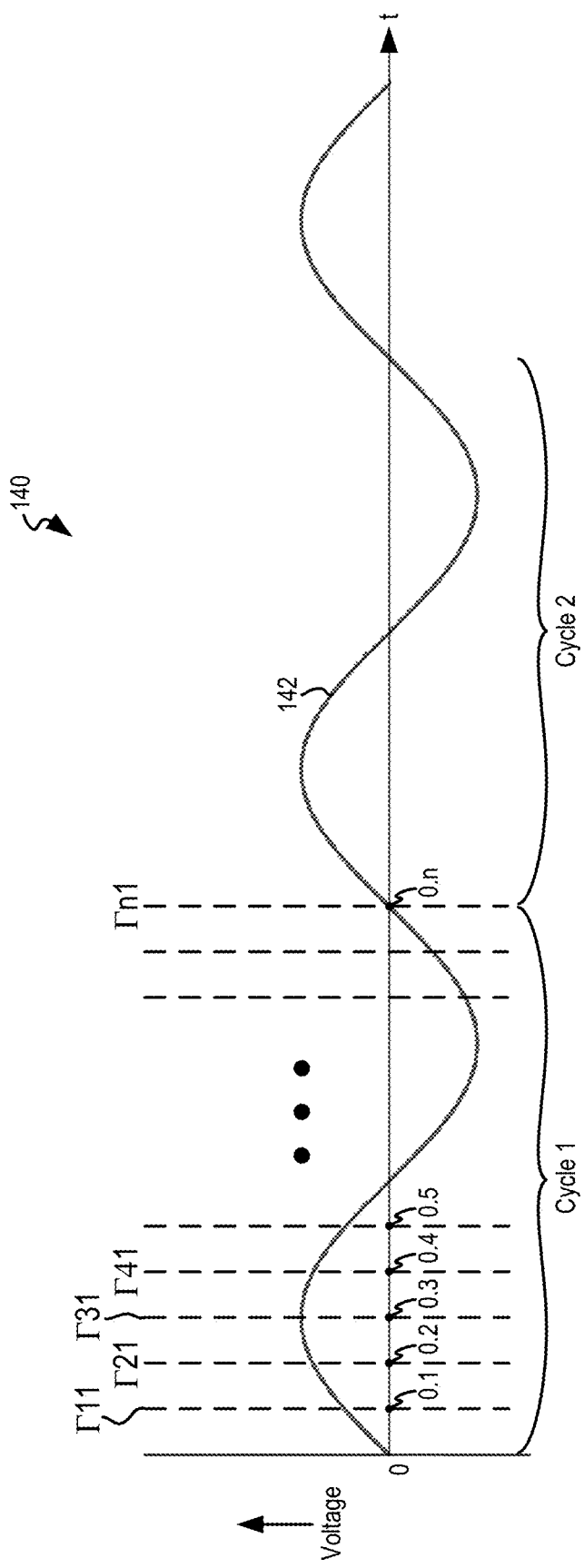

(During processing)

(During processing)

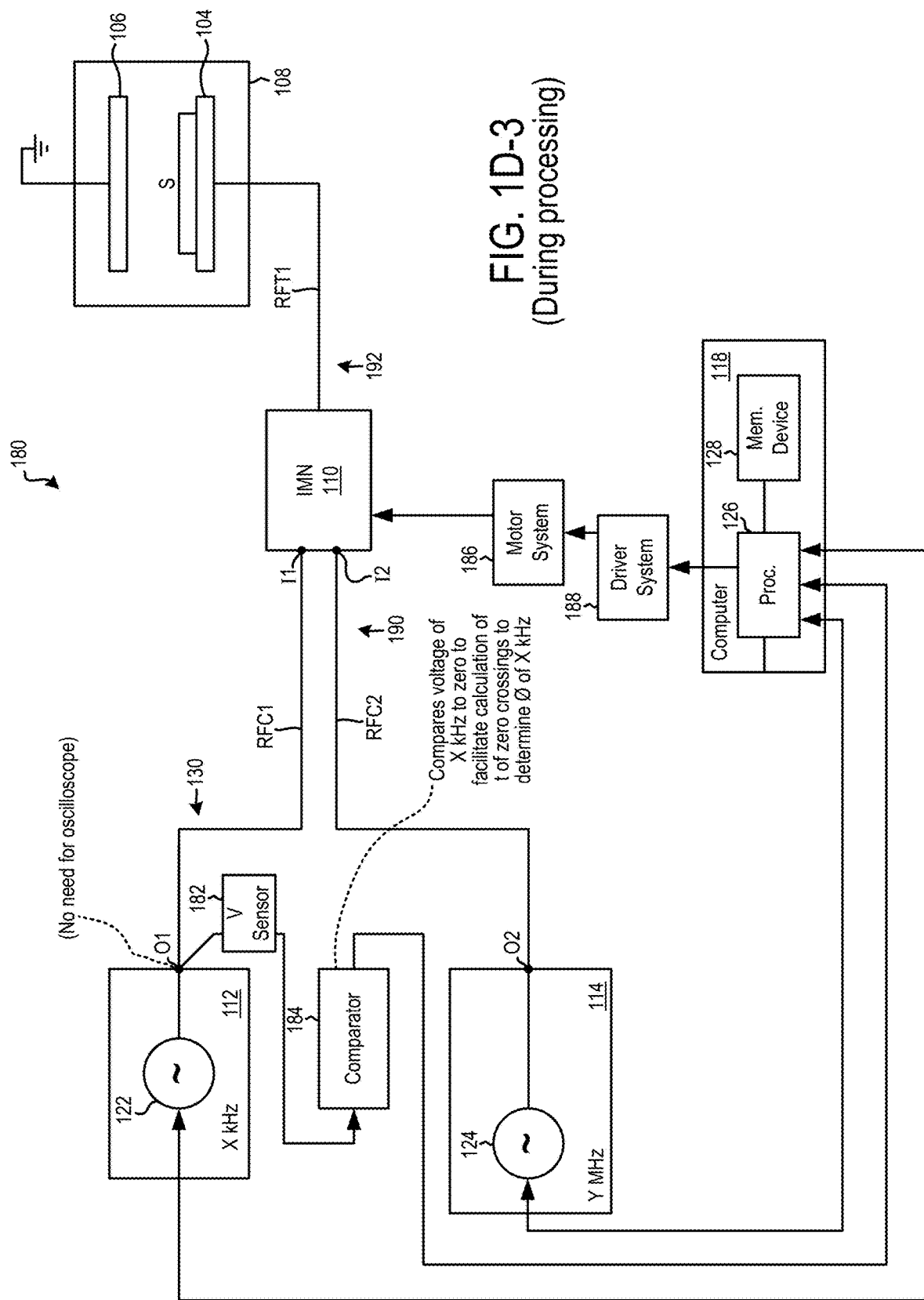
FIG. 1D-3 (During processing)

(Illustrates that Γ is a complex no. having a phase)

(Γ over 1 cycle of x kHz)

(After applying the method)

(Γ after applying the method)

(During Recipe Development)

| X kHz | t (μs) | Γ (complex) |
|---|---|---|
| 1 cycle (See Fig. 2A) | 0.1 | Γ11 |
| | 0.2 | Γ21 |
| | 0.3 | Γ31 |
| | • | • |
| | • | • |
| | • | • |
| | 0.n | Γn1 |

Can be calculated from complex V & I for Y MHz (see Fig. 2D & Fig. 2E)

Could be average over 10 cycles of X kHz 130 (By Computer)

FIG. 4B
(During Recipe Devleopment)

(During Recipe Development)

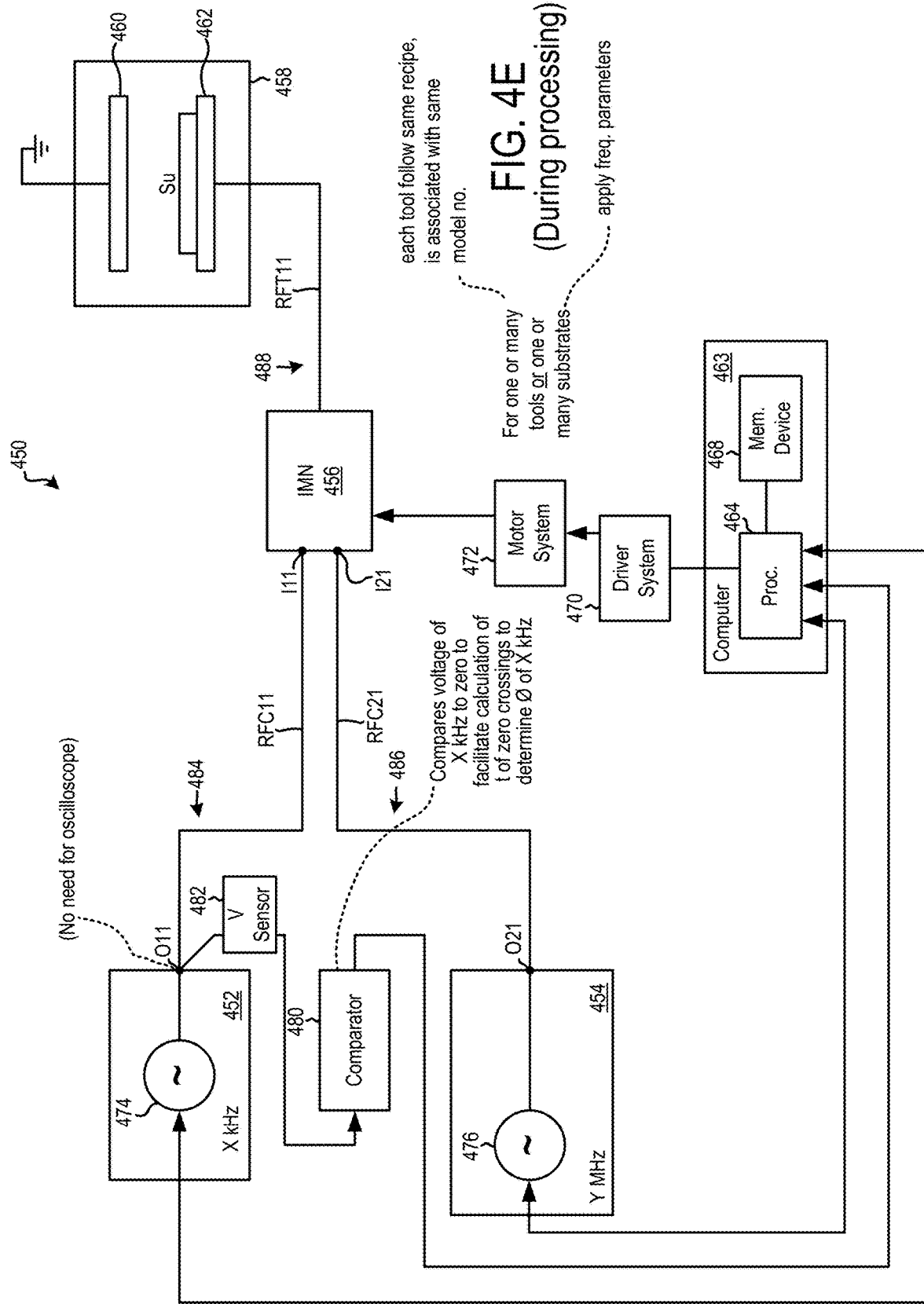

(During Recipe Development)

| X kHz | Bin | Γ (complex) |
|---|---|---|
| 1 cycle (See Fig. 2A) | 0.1 | Γ11 |
| | 0.2 | Γ21 |
| | 0.3 | Γ31 |
| | • | • |
| | • | • |
| | • | • |
| | 0.n | Γn1 |

Γ (complex): Can be calculated from complex V & I for Y MHz (see Fig. 2D & Fig. 2E)

Γ11, Γ21, Γ31: Could be average over 10 cycles of X kHz 510 (By Computer)

FIG. 5B

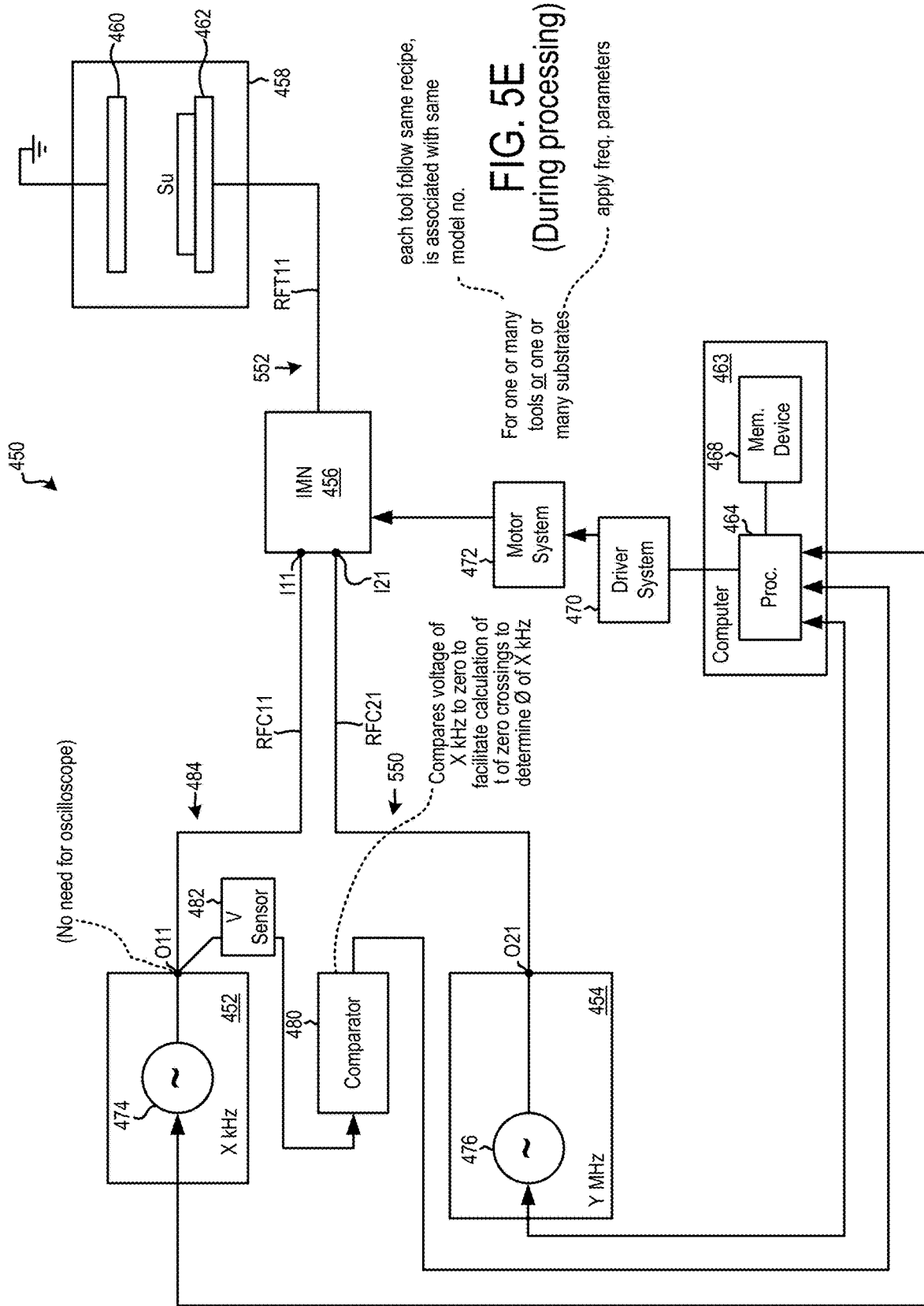
FIG. 5E (During processing)

SYSTEMS AND METHODS FOR TUNING A MHZ RF GENERATOR WITHIN A CYCLE OF OPERATION OF A KHZ RF GENERATOR

This application is a national stage filing of and claims priority, under 35 U.S.C. § 371, to PCT/US2020/031723, filed on May 6, 2020, and titled "SYSTEMS AND METHODS FOR TUNING A MHZ RF GENERATOR WITHIN A CYCLE OF OPERATION OF A KHZ RF GENERATOR", which claims the benefit of and priority, under 35 U.S.C. § 119(e), to U.S. Provisional Patent Application No. 62/858,538, filed on Jun. 7, 2019, and titled "SYSTEMS AND METHODS FOR TUNING A MHZ RF GENERATOR WITHIN A CYCLE OF OPERATION OF A KHZ RF GENERATOR", both of which are incorporated by reference herein in their entirety.

FIELD

The present embodiments relate to systems and methods for tuning a megahertz (MHz) radio frequency (RF) generator during a cycle of operation of a kilohertz (kHz) RF generator.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, one or more radio frequency (RF) generators are coupled to an impedance matching circuit. The impedance matching circuit is coupled to a plasma chamber. RF signals are supplied from the RF generators to the impedance matching circuit. The impedance matching circuit outputs an RF signal upon receiving the RF signals. The RF signal is supplied from the impedance matching circuit to the plasma chamber for processing a wafer in the plasma chamber. During processing of the wafer, an amount of power is reflected from plasma of the plasma chamber via the impedance matching circuit towards the one or more RF generators. The reflected power reduces efficiency in processing the wafer and also causes damage to the one or more RF generators.

It is in this context that embodiments described in the present disclosure arise.

SUMMARY

Embodiments of the disclosure provide apparatus, methods and computer programs for tuning a megahertz (MHz) radio frequency (RF) generator during a cycle of operation of a kilohertz (kHz) RF generator. It should be appreciated that the present embodiments can be implemented in numerous ways, e.g., a process, an apparatus, a system, a piece of hardware, or a method on a computer-readable medium. Several embodiments are described below.

Several plasma etch systems operate with two different RF frequencies, one lower, such as 400 kilohertz (kHz), and one more than 100 times higher, e.g., 60 megahertz (MHz). A load impedance for the higher RF frequency may be strongly modulated by the lower RF frequency. A matching network for each RF frequency is tuned using one variable capacitor plus a variable RF frequency. For example, the higher RF frequency is tuned to a value in a range between 57 MHz and 63 MHz. A single value of the load impedance can be tuned to have a voltage reflection coefficient $\Gamma$ near zero, but because an impedance of the higher RF frequency varies with a phase of the low frequency RF, it is difficult to determine a single combination of the variable capacitor and the higher RF frequency that works for all portions of a cycle of the lower RF frequency. Without the single combination, a time-averaged power reflection coefficient $\Gamma^2$ can be as high as 50%.

In one embodiment, a method is provided in which the higher RF frequency has an average value plus a variation around the average value. The variation is periodic with the lower RF frequency and has a predetermined functional form. For example, the variation is a square wave with an amplitude and a phase relative to the lower RF frequency. As another example, the variation is a sinusoidal function or a rectangular function. As yet another example, the variation is a trapezoidal function with high and low frequency segments connected by frequency ramps.

In a first embodiment, a method for determining frequency parameters and match network parameters is provided for controlling an RF generator of the higher frequency. In the first embodiment, the following operations are performed:
1. A plasma tool detects a frequency and phase of a waveform of the lower frequency. As an example, the lower frequency is detected by querying an RF generator of the lower frequency and a phase of the lower frequency is deduced from detecting voltage zero crossings of the lower frequency.
2. The plasma tool uses a sensor and fast data acquisition to save waveforms of the higher frequency measured between the RF generator of the higher frequency and the matching network over a time period of one or a few cycles of the lower frequency. As an example, the sensor measures complex voltage and current.
3. A computer calculates an instantaneous complex voltage reflection coefficient $\Gamma$ for a number of short, e.g., about 0.1 microsecond, time intervals. The computer also calculates an average power reflection coefficient $\Gamma^2$ associated with the RF generator of the higher frequency over a period of the lower frequency.
4. The computer calculates a set of optimum parameters to minimize a predicted value of the average power reflection coefficient. For example, the computer:
    a. Divides a measured voltage waveform of the lower frequency into short segments of about 0.1 microseconds each to generate approximately 25 short segments per period of the lower frequency.
    b. Calculates the complex voltage reflection coefficient $\Gamma$ of the higher frequency for each segment.
    c. Applies a computer-based model of an RF path of the plasma tool to calculate a load impedance for each segment from the complex voltage reflection coefficient $\Gamma$. Inputs to the calculation include a known RF frequency and variable capacitor values.
    d. For a predetermined functional form of the higher frequency, calculates a set of frequency parameters, which minimize a period-averaged reflection coefficient associated with the RF generator of the higher frequency. As an example, the frequency parameters include:
        i. A constant average frequency of the RF generator of the higher frequency.
        ii. An amplitude of a trapezoidal frequency variation.

iii. Durations of high and low sections of the trapezoidal frequency variation, and
iv. A phase of the trapezoidal frequency variation relative to the phase of the lower frequency,
5. The optimization to minimize an average power reflection coefficient includes a value of the variable capacitor as well as the higher frequency.
6. The computer applies the frequency variation.
7. The computer iterates the operations 2 through 5. After applying the method, a power reflection coefficient at the RF generator of the higher frequency decreases to about 3% from about 35%.

In a second embodiment, a method is provided to reduce a voltage reflection coefficient and power reflection coefficient at an input of the computer-based model. The method is executed during recipe development to determine operation parameters, and the operation parameters are applied during processing of a substrate. In the method, the following operations are performed:
1. A fast data acquisition device and the sensor are installed during recipe development and are not used on production tools during the processing to reduce difficulties and time associated with using the fast data acquisition device and the sensor. An example of a fast data acquisition device includes an oscilloscope.
2. During the recipe development, two operations are performed:
   a. A tuning operation, which determines a value of an average frequency to be applied to an RF generator of the higher frequency.
   b. A fast data sensing, acquisition, and computer analysis operation, which determines a frequency variation in the average frequency. As an example, the two operations are executed to minimize an average voltage reflection coefficient, for which positive and negative values can average to zero. This means the average voltage reflection coefficient can be zero even though an average power reflection coefficient may be large. To further illustrate, an operation of choosing the frequency variation coincides with an operation for determining the average frequency. The frequency variation around the average frequency is determined simultaneously with the operation for determining the average frequency. For multiple RF generators, the average frequency is determined by minimizing a portion of reflected power at the fundamental frequency while ignoring the remaining portion of the reflected power at one or more modulated sideband frequencies of the reflected power. This is equivalent to minimizing a Fourier peak of the reflected power at the fundamental frequency, or to minimizing the average voltage reflection coefficient, which is a complex number, for which positive and negative parts cancel each other.
3. During the recipe development, the average frequency and frequency variation are determined in a manner that is the same as that described above in the first embodiment, with an additional constraint that the average voltage reflection coefficient be simultaneously minimized
4. The computer stores the frequency parameters.
5. During the processing, for a given recipe, a tool-to-tool variation or wafer-to-wafer variation is in an average value of the higher frequency. The average frequency determined during the recipe development is applied during the processing to minimize an average voltage reflection coefficient. Then, on top of the average frequency, a frequency variation previously determined for that recipe, is applied from tool-to-tool or wafer-to-wafer. A timing and duration of the frequency variation is synchronized with a zero-crossing and period of the RF generator of the lower frequency. In the second embodiment, there is no use of the fast data acquisition device and/or the sensor during processing.

In an embodiment, a method is provided in which the higher RF frequency is tuned in two parts. The first part determines an average value of the higher RF frequency, which will remain constant for many cycles of the lower RF frequency. The second part determines fast variations around the average value to be applied within a cycle of the lower RF frequency.

In a third embodiment, a method is described to reduce power reflection coefficient for each bin within a cycle of the lower RF frequency. The lower RF frequency is divided into multiple bins. There is no predetermined functional form used in the third embodiment. The following operations are performed in the third embodiment:
1. During recipe development, the computer executes a fast frequency variation operation by sub-dividing a period or cycle of the lower RF frequency into a number of shorter time bins. For example, the period of the lower RF frequency is divided into 16 bins. A length or a time period of each bin depends on a value of the lower RF frequency. An example of the lower RF frequency is a frequency ranging from 340 kHz to 440 kHz.
2. During recipe development, the computer applies the computer-based model to minimize an average power reflection coefficient for the bins by varying:
   a. the variable capacitor to determine a capacitance,
   b. an average frequency of the higher RF frequency,
   c. a frequency variation from the average frequency, and
   d. subject to a constraint that an average voltage reflection coefficient is also minimized
3. During tool operation in which a substrate is processed, an assumption is made that for a given recipe, the tool-to-tool or wafer-to-wafer variations are in an average value of the higher RF frequency.
4. Also, during the tool operation, on top of the average frequency of the higher RF frequency, the frequency variation previously determined for that recipe is applied by the computer from bin to bin. A timing and duration of the frequency variation is synchronized by the computer with a zero-crossing and period of the lower RF frequency. Also, during the tool operation, the capacitance determined during the recipe development is applied for all bins of the lower RF frequency.

In one embodiment, a tuning method is described. The tuning method includes accessing, for a first set of one or more cycles of operation of a first radio frequency generator, a plurality of reflection parameter values associated with a second radio frequency generator. The tuning method further includes calculating a plurality of load impedance parameter values from the plurality of reflection parameter values by applying the plurality of reflection parameter values to a computer-based model of at least a portion of a radio frequency path. The radio frequency path is between the second radio frequency generator and an electrode of a plasma chamber. The tuning method also includes receiving a plurality of frequency modulation parameters of a radio frequency signal to be generated by the second radio frequency generator. The tuning method further includes determining values of the plurality of frequency modulation parameters by applying the plurality of load impedance parameter values to the computer-based model. The values of the plurality of frequency modulation parameters are determined to minimize a reflection coefficient parameter at an input of the computer-based model. The tuning method includes controlling the second radio frequency generator according to the values of the plurality of frequency modulation parameters during a second set of one or more cycles of operation of the first radio frequency generator.

In an embodiment, a tuning method is described. A portion of the tuning method is executed during recipe development and another portion of the tuning method is executed during processing. The portion executed during the recipe development includes accessing, for a set of one or more cycles of operation of a first radio frequency generator, a plurality of reflection parameter values associated with a second radio frequency generator. Moreover, the portion executed during the recipe development further includes calculating a plurality of load impedance parameter values from the plurality of reflection parameter values by applying the plurality of reflection parameter values to a computer-based model of at least a portion of a radio frequency path. The radio frequency path is between the second radio frequency generator and an electrode of a plasma chamber. The portion executed during the recipe development also includes receiving a plurality of frequency modulation parameters of a radio frequency signal to be generated by the second radio frequency generator. The portion executed during the recipe development further includes determining values of the plurality of frequency modulation parameters by applying the plurality of load impedance parameter values to the computer-based model. The values of the plurality of frequency modulation parameters are determined to minimize one or more reflection coefficient parameters at an input of the computer-based model. The other portion of the method is executed during processing of a substrate within another plasma chamber. The other portion of the method includes controlling a third radio frequency generator according to the values of the plurality of frequency modulation parameters determined during the recipe development. The operation of controlling the third radio frequency generator is performed during a set of one or more cycles of operation of a fourth radio frequency generator.

In an embodiment, a tuning method is described. A portion of the tuning method is executed during recipe development and another portion of the tuning method is executed during processing. The portion executed during the recipe development includes accessing, for a set of one or more cycles of operation of a first radio frequency generator, a plurality of reflection parameter values associated with a second radio frequency generator. The portion executed during the recipe development further includes calculating a plurality of load impedance parameter values from the plurality of reflection parameter values by applying the plurality of reflection parameter values to a computer-based model of at least a portion of a radio frequency path between the second radio frequency generator and an electrode of a plasma chamber. The portion executed during the recipe development also includes receiving a plurality of frequency modulation parameters of a radio frequency signal to be generated by the second radio frequency generator, wherein the plurality of frequency modulation parameters include a frequency variation of the radio frequency signal. The portion executed during the recipe development further includes determining values of the plurality of frequency modulation parameters by applying the plurality of load impedance parameter values to the computer-based model. The values of the plurality of frequency modulation parameters are determined to minimize one or more reflection coefficient parameters at an input of the computer-based model. The other portion of the method is executed during processing of a substrate within another plasma chamber. The other portion of the method includes controlling a third radio frequency generator according to the values of the plurality of frequency modulation parameters determined during the recipe development. The operation of controlling the third radio frequency generator includes applying the values of the plurality of frequency modulation parameters to a baseline frequency of operation of the third radio frequency generator.

In an embodiment, a tuning method is described. A portion of the tuning method is executed during recipe development and another portion of the tuning method is executed during processing. The portion executed during the recipe development includes accessing, for a set of one or more cycles of operation of a first radio frequency generator, a plurality of reflection parameter values associated with a second radio frequency generator. Each of the plurality of reflection parameter values corresponds to a bin of each of the one or more cycles of operation of the first radio frequency generator. The portion executed during the recipe development further includes calculating a plurality of load impedance parameter values from the plurality of reflection parameter values by applying the plurality of reflection parameter values to a computer-based model of at least a portion of a radio frequency path. The radio frequency path is between the second radio frequency generator and an electrode of a plasma chamber. The portion executed during the recipe development also includes determining values of a plurality of frequency modulation parameters by applying the plurality of load impedance parameter values to the computer-based model. The values of the plurality of frequency modulation parameters are determined to minimize a plurality of values of a reflection coefficient parameter at an input of the computer-based model for each of the bins. The other portion of the method is executed during processing of a substrate within another plasma chamber. The other portion of the method includes controlling a third radio frequency generator according to the values of the plurality of frequency modulation parameters determined during the recipe development. The operation of controlling the third frequency generator is performed during a set of one or more cycles of operation of a fourth radio frequency generator.

Some advantages of the herein described systems and methods include finding values of the higher RF frequency and of the variable capacitor that reduces power and/or voltage that is reflected towards the megahertz RF generator during each cycle of operation of the kilohertz RF generator. Additional advantages include reducing a number of sensors and fast data acquisition devices during processing of a substrate. For example, in the second and third embodiments, there is no need to use the fast data acquisition devices and sensors after recipe development. Once a recipe having the values of the higher RF frequency and of the variable capacitor is determined, the recipe is applied during processing of the substrate. There is no need to again measure a complex voltage and current during the processing of the substrate.

Further advantages include applying the predetermined functional form. The application of the predetermined functional form simplifies a determination of the frequency parameters and an application of the operation parameters. It is easy to control the RF generator of the higher frequency to follow the predetermined functional form.

Moreover, when the computer-based model is used, there is no need to use a sensor on the RF path. For example, the sensor is not coupled to an RF transmission line or an output of the impedance matching network. Rather, a complex voltage and current is measured by a sensor coupled to an output of the megahertz RF generator and is propagated via the computer-based model to facilitate a determination of the values of the higher frequency and the variable capacitor. It is more difficult and time-consuming to use the sensor on the RF path than to use the computer-based model.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1B-1 is an embodiment of a table to illustrate that values of the voltage reflection coefficient are determined based on a complex voltage and current that is obtained at periodic time intervals over a cycle of operation of the X kilohertz RF generator.

FIG. 1B-2 is an embodiment of a graph to illustrate a correspondence between the values of the voltage reflection coefficient and time intervals during a cycle of an RF signal generated by the X kilohertz RF generator.

FIG. 1D-1 is a diagram of an embodiment of the RF path model to illustrate a determination of operation parameters, which include frequency parameters and match network parameters, based on application of the load impedance values at an output of the RF path model to minimize an average power reflection coefficient at an input of the RF path model.

FIG. 1D-2 is an embodiment of a graph to illustrate multiple cycles of an RF signal that is generated by an X kilohertz RF generator.

FIG. 1D-3 is a diagram of an embodiment of a system to apply values of the operation parameters during a set of cycles of operation of the X kilohertz RF generator of FIG. 1 during processing of a substrate.

FIG. 4B is a diagram of an embodiment of the table, which is generated by a processor during recipe development in the same manner in which the table of FIG. 1B-1 is generated by the processor during processing of the substrate.

FIG. 4E is a diagram of an embodiment of a system to illustrate an application, during processing, of the values of the operation parameters that are determined during recipe development.

FIG. 5B is a diagram of an embodiment of a table that is generated by the processor for recipe development for each bin of one or more cycles of operation of the X kilohertz RF generator.

FIG. 5E is a diagram of an embodiment of a system to illustrate use of the operation parameters for each bin during processing of a substrate.

DETAILED DESCRIPTION

The following embodiments describe systems and methods for tuning a megahertz (MHz) radio frequency (RF) generator during a cycle of operation of a kilohertz (kHz) RF generator. It will be apparent that the present embodiments may be practiced without some or all of these specific details. In other instances, well known process operations have not been described in detail in order not to unnecessarily obscure the present embodiments.

Figure 1A:
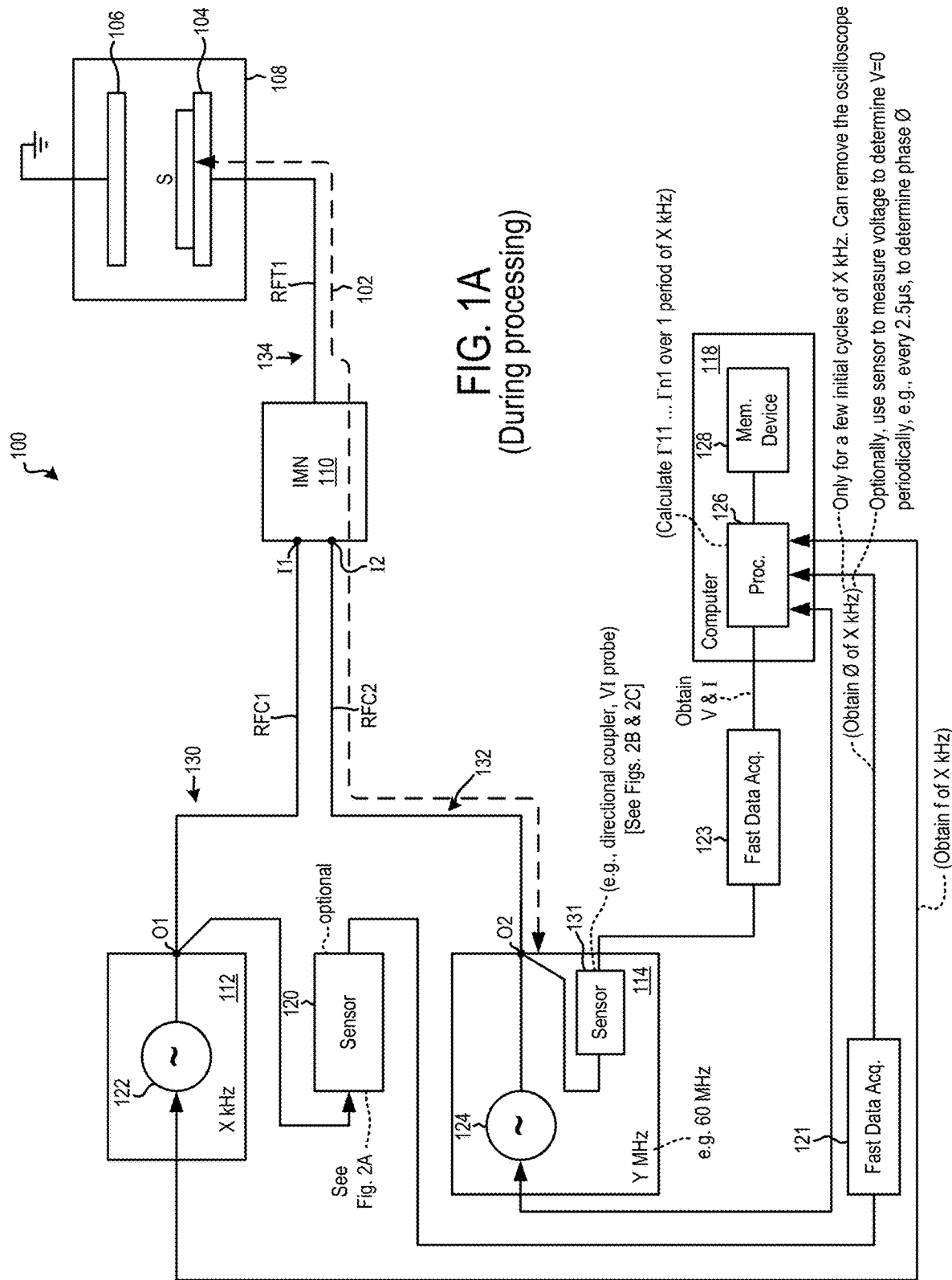
FIG. 1A is a diagram of an embodiment of a system to illustrate a determination of values of a voltage reflection coefficient over one or more cycles of operation of an X kilohertz radio frequency (RF) generator.

FIG. 1A is a diagram of an embodiment of a system 100, such as a plasma tool, to illustrate a determination of values of a voltage reflection coefficient over one or more cycles of operation of an X kilohertz RF generator 112. The system 100 includes the X kilohertz RF generator 112, a Y megahertz RF generator 114, a computer 118, and a plasma chamber 108. The system 100 also includes an impedance matching network 110, a sensor 120, and a fast data acquisition device 121. An example of the sensor 120 is a voltage sensor and an example of a fast data acquisition device is a digital storage oscilloscope. Another example of a fast data acquisition device is a fast data acquisition circuit board. The sensor 120 and the fast data acquisition device 121 together measure forward voltage and reverse voltage. To illustrate, the sensor 120 and the fast data acquisition device 121 measure a forward voltage amplitude, a reverse voltage amplitude, and a phase between the forward voltage amplitude and the reverse voltage amplitude. It should be noted that the terms reverse voltage and reflected voltage are used herein interchangeably.

An example of an X kilohertz RF generator, as described herein, includes a 400 kHz RF generator or another RF generator that operates in kilohertz frequencies. An example of a Y megahertz RF generator, as described herein, include a 2 MHz RF generator or a 13.56 MHz RF generator or a 27 MHz RF generator or a 60 MHz RF generator. Examples of a computer, described herein, include a desktop computer, a laptop computer, a smart phone, and a tablet.

The computer 118 includes a processor 126 and a memory device 128. The processor 126 is coupled to the memory device 128 and is also coupled to the RF power supplies 122 and 124. As used herein, instead of a processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. The processor 126 is coupled via a cable, such as a serial transfer cable, a parallel transfer cable, or a universal serial bus (USB) cable, to the fast data acquisition device 121, which is coupled to the sensor 120.

An example of a fast data acquisition device, described herein, is a device for acquiring data regarding oscillations or frequencies of oscillations of a voltage or power of an RF signal that is output at an output terminal of an RF generator. The sensor 120 is coupled to an output O1 of the X megahertz RF generator 112 via a directional coupler. The Y megahertz RF generator 114 includes a sensor 131, such as a complex voltage and current probe or a complex voltage sensor. The sensor 131 is coupled to an output terminal O2 of the Y megahertz RF generator 114. The sensor 131 is also coupled to a fast data acquisition device 123, which is coupled via a cable to the processor 126. Examples of the cable are provided above.

The impedance matching network 106 includes one or more circuit components, e.g., one or more inductors, or one or more capacitors, or one or more resistors, or a combination or two or more thereof, etc., which are coupled with each other. For example, the impedance matching network 106 includes two branches. Each of the two branches includes multiple circuit components that are coupled to each other in a serial or parallel manner One of the two branches is coupled to the X kilohertz RF generator 112 and another one of the two branches coupled to the Y megahertz RF generator 114 and the branches are coupled to an output of the impedance matching network 106. It should be noted that the terms impedance matching network, a match, impedance matching circuit, a match circuit, and match network are used herein interchangeably.

An example of the plasma chamber 108 is a capacitively coupled (CCP) plasma chamber in which an upper electrode 106 and a bottom electrode of a plasma excitation electrode 104 are placed in a manner to be capacitively coupled with each other. For example, the upper electrode 106 is placed above the plasma excitation electrode 104 to form a gap between the upper electrode 106 and the plasma excitation electrode 104. The upper electrode 106 is coupled to a ground potential. Radio frequency power is capacitively coupled between the upper electrode 106 and the plasma excitation electrode 104 via the gap. Each of the lower electrode and the upper electrode 106 is made of a metal, e.g., anodized aluminum, alloy of aluminum, etc.

The output terminal O1 of the X kilohertz RF generator 112 is coupled to an input terminal I1 of the impedance matching network 110 via an RF cable RFC1 and the output terminal O2 of the Y megahertz RF generator 114 is coupled to another input terminal I2 of the impedance matching network 110 via another RF cable RFC2. Also, the output of the impedance matching network 110 is coupled to the bottom electrode of the plasma excitation electrode 104 via an RF transmission line RFT1.

The X kilohertz RF generator 112 includes the RF power supply 122, which is an RF oscillator. Similarly the Y kilohertz RF generator 114 includes the RF power supply 124, which is also an RF oscillator. The RF oscillator 122 is coupled to the output terminal O1 and the RF oscillator 124 is coupled to the output terminal O2. A combination of the RF cable RFC2, the branch of the impedance matching network 110 that is coupled between the input I2 and the output of impedance matching network 110, the RF transmission line RFT1, and the plasma excitation electrode 104 is referred to herein as an RF path 102. Another branch of the impedance matching network 110 is coupled between the input I1 and the output of the impedance matching network 110.

A substrate S, such as a semiconductor wafer, is placed on a top surface of the plasma excitation electrode 104 for being processed, which may include etching a layer of the substrate S, or deposition of a material on the substrate S, or sputtering the substrate S, or cleaning the substrate S, or a combination thereof. During the processing of the substrate S, the processor 126 provides one or more power values and one or more frequency values to the RF power supply 122 of the X kilohertz RF generator 112 and provides one or more power values and one or more frequency values to the RF power supply 124 of the Y megahertz RF generator 114.

Upon receiving the power values and the frequency values, the RF power supply 122 generates an RF signal 130 having the power values and the frequency values, and supplies the RF signal 130 via the output O1 and the RF cable RFC1 to the input I1 of the impedance matching network 110. Similarly, upon receiving the power values and the frequency values, the RF power supply 124 generates an RF signal 132 having the power values and the frequency values, and supplies the RF signal 132 via the output O2 and the RF cable RFC2 to the input I2 of the impedance matching network 110.

The impedance matching network 110 receives the RF signals 130 and 132 and matches an impedance of a load that is coupled to the output of impedance matching network 110 with that of a source that is coupled to the inputs I1 and I2 of the impedance matching network 110, and combines the RF signals 130 and 132 to output a modified RF signal 134 at the output of impedance matching network 110. An example of the load coupled to the output of the impedance matching network 110 includes the plasma chamber 108 and the RF transmission line RFT1. An example of the source coupled to the inputs I11 and I21 include the X kilohertz RF generator 112, the Y megahertz RF generator 114, and the RF cables RFC1 and RFC2. The modified RF signal 134 is supplied via the RF transmission line RFT1 and to the lower electrode of the plasma excitation electrode 104 to strike or maintain plasma in the gap formed between the plasma excitation electrode 104 and the upper electrode 106 of the plasma chamber 108. The plasma of the plasma chamber 108 has RF power that processes the substrate S.

During processing of the substrate S, the sensor 120 and the fast data acquisition device 121 measure a voltage or power of the RF signal 130 that is output from the X kilohertz RF generator 112 to output a waveform, such as a voltage waveform or a power waveform. The waveform that is measured by the sensor 120 and the fast data acquisition device 121 has a phase $\phi$ of the RF signal 130. The phase $\phi$ of the RF signal 130 provides crossings or times at which the waveform of the RF signal 130 crosses a zero value of voltage or power. The waveform of the RF signal 130 is sinusoidal or substantially sinusoidal and crosses the zero value of voltage or power at periodic time intervals.

The processor 126 receives values of the waveform that is measured by the sensor 120 and the fast data acquisition device 121 via the cable to determine the phase $\phi$ of the waveform of the RF signal 130. For example, the processor 126 determines times at which the waveform of the RF signal 130 become zero at positive crossings and the times define the phase $\phi$. At the positive crossings, the waveform of the RF signal 130 transitions from a negative value to a positive value.

Also, during processing of the substrate S, the sensor 131 and the fast data acquisition device measure a forward voltage amplitude, a reverse voltage amplitude, and a phase between the forward and reverse voltage amplitudes at the output O2 of the Y megahertz RF generator 114 and provides the amplitudes and the phase via the cable to the processor 126. The processor 126 determines based on the forward voltage amplitude, the reverse voltage amplitude, and the phase, multiple values $\Gamma 11$, $\Gamma 21$ through $\Gamma n1$ of a voltage reflection coefficient over one cycle, such as one time period, of the RF signal 130, where n is an integer greater than two. For example, the processor 126 determines the values of the voltage reflection coefficient as a ratio of a voltage that is reflected at the output O2 towards the Y megahertz RF generator 114 to a voltage that is supplied at the output O2 from the Y megahertz RF generator 114. The reflected voltage is a complex number having an amplitude and a phase and the supplied voltage is also a complex number having an amplitude and a phase. The terms supplied voltage and forward voltage are used herein interchangeably. The voltage that is reflected towards the Y megahertz RF generator 114 is reflected from the plasma chamber 108 via the RF path 102. The voltage that is reflected and the voltage that is supplied at the output O2 are identified by the processor 126 from the forward voltage amplitude, the reverse voltage amplitude, and the phase between the amplitudes measured by the sensor 131 and the fast data acquisition device 123. The processor 126 stores the values $\Gamma 11$, $\Gamma 21$ through $\Gamma n1$ of the voltage reflection coefficient in the memory device 128 and accesses, such as obtains or reads, the values $\Gamma 11$, $\Gamma 21$ through $\Gamma n1$ from the memory device 128. A voltage reflection coefficient is an example of a reflection parameter or a reflection coefficient parameter. Another example of the reflection parameter is a complex voltage and current or another parameter that has a complex value.

In an embodiment, the processor 126 is coupled to an RF power supply of an RF generator via a digital signal processor of the RF generator and one or more power controllers of the RF generator and one or more frequency tuners of the RF generator. The digital signal processor is coupled to the processor 126 and to the one or more power controllers and to the one or more frequency tuners. The power controllers control power values that are output from the RF power supply of the RF generator during different states, such as a high logic state and a low logic state, and the frequency tuners are controllers that control frequency values that are output from the RF power supply of the RF generator during the different states.

In one embodiment, the sensor 120 and the fast data acquisition device 121 measure voltage of the RF signal 130 at the output O1. The measured voltage is provided to the processor 126 from the voltage sensor via a cable that couples the voltage sensor to the processor 126. The processor 126 determines times at which the measured voltage is zero while crossing a positive crossing to determine the phase $\phi$ of the voltage of the RF signal 130.

In an embodiment, the sensor 120 is coupled to the output O1 of the X kilohertz RF generator 112 for a predetermined number of initial cycles of operation of the X kilohertz RF generator 112 or of the RF signal 130. After the predetermined number of initial cycles, the sensor 120 is disconnected from the output O1. The processor 126 determines that the phase of the RF signal 130 will continue to be the same as that determined with the measured values of voltage of the RF signal 130 received from the sensor 120.

In one embodiment, the sensor 131 is located outside the Y megahertz RF generator 114 and is coupled to the output O2 of the Y megahertz RF generator 114. In an embodiment, the sensor 120 is located within the X kilohertz RF generator 112.

It should be noted that in an embodiment, instead of applying the modified RF signal 134 to the lower electrode of the plasma excitation electrode 104 and coupling the upper electrode 106 to the ground potential, the modified RF signal 134 is applied to the upper electrode 106 and the lower electrode of the plasma excitation electrode 104 is coupled to the ground potential.

In one embodiment, instead of coupling the upper electrode 106 to the ground potential, the upper electrode is coupled to one or more RF generators via an impedance matching network.

In an embodiment, instead of the sensor 120, a voltage and current probe (VI probe) that measures a complex voltage and current is used. The complex voltage and current includes a current amplitude, a voltage amplitude, and a phase between the current amplitude and the voltage amplitude.

In one embodiment, a cycle of operation of an RF generator occurs to generate a cycle of an RF signal. For example, during one cycle of operation of an RF generator, described herein, one period of an RF signal is generated by the RF generator.

In an embodiment, the sensor 131 and the fast data acquisition device 123 measure the complex voltage and current, which includes a voltage amplitude, a current amplitude, and a phase between the voltage amplitude and the current amplitude. The sensor 131 and the fast data acquisition device 123 provide the amplitudes and the phase via the cable to the processor 126. The processor 126 determines based on the voltage amplitude, the current amplitude, and the phase, multiple values $\Gamma 11$, $\Gamma 21$ through $\Gamma n1$ of a voltage reflection coefficient over one cycle of the RF signal 130.

In one embodiment, both the sensors 120 and 131 are coupled to the same fast data acquisition device 121 or 123.

In an embodiment, the terms values and amounts are used herein interchangeably. For example, the terms values of frequency modulation parameters and amounts of frequency modulation parameters are used herein interchangeably. To illustrate, the amount represents a quantity of a frequency modulation parameter and the value represents another quantity of the frequency modulation parameter.

Figure 1C:
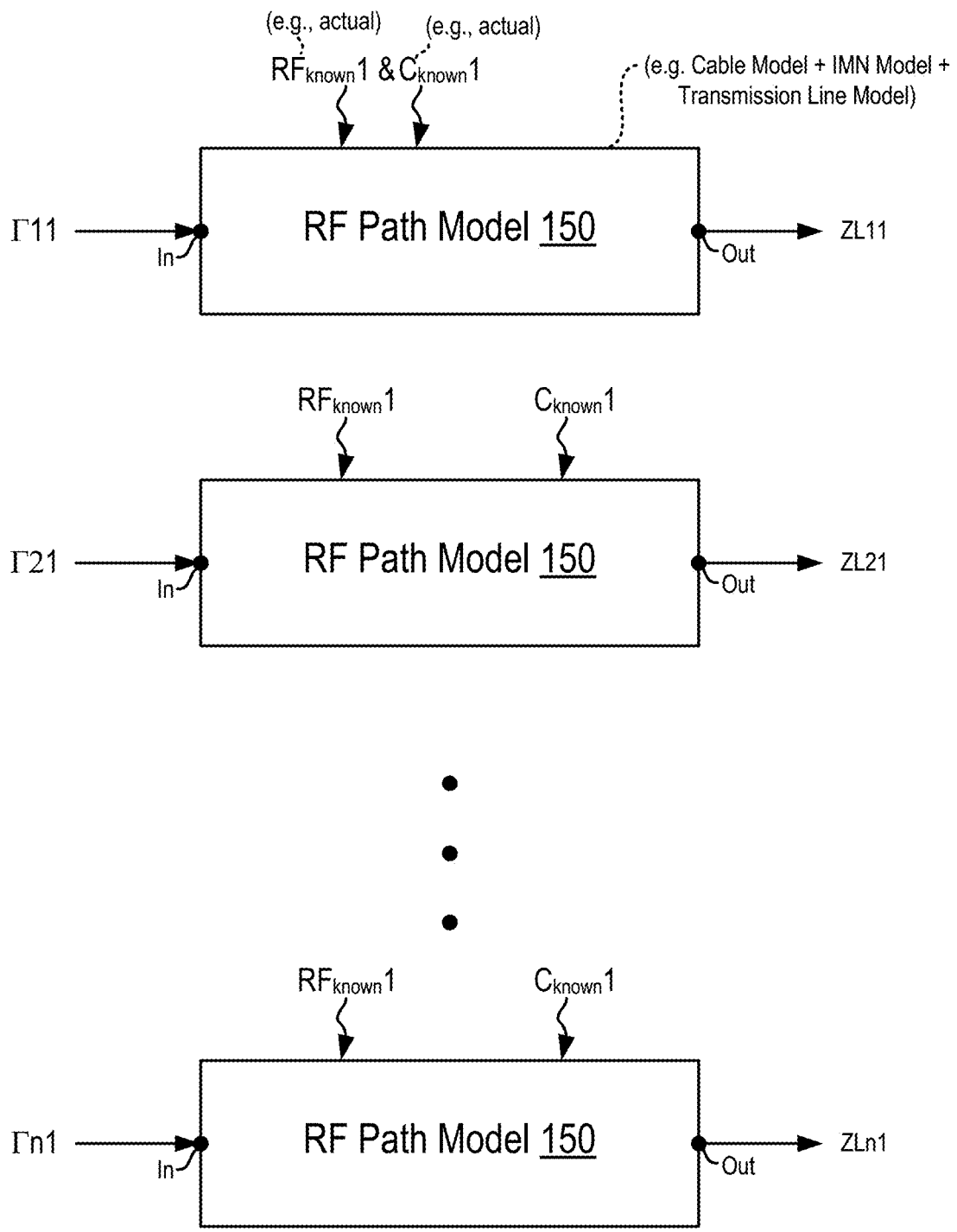
FIG. 1C is a diagram of an embodiment of an RF path model to illustrate calculation of load impedance values from the values of the voltage reflection coefficient.
Figures 1, 1D:
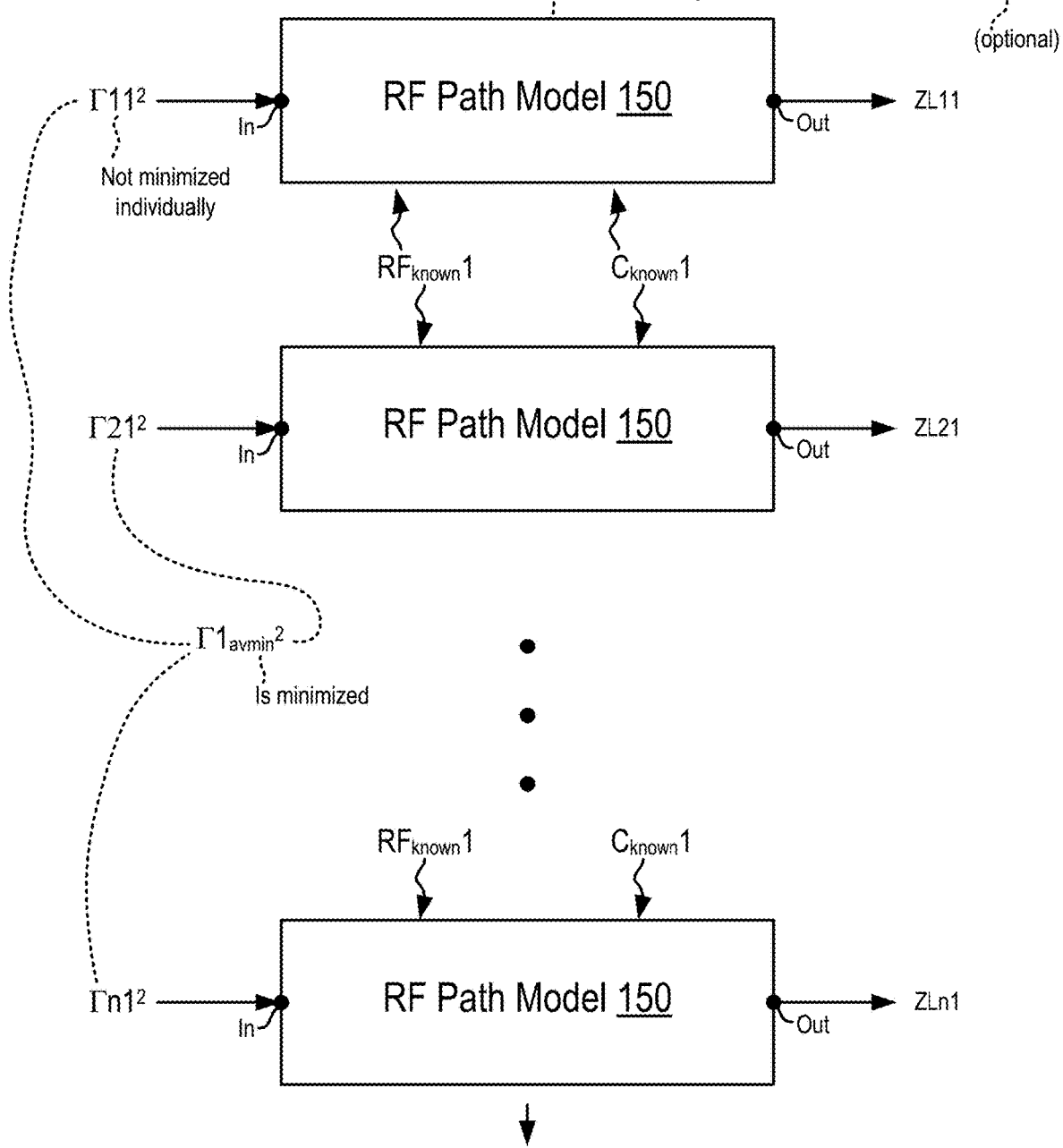

FIG. 1B-1 is an embodiment of a table 130 to illustrate that the values $\Gamma 11$, $\Gamma 21$ through $\Gamma n1$ of the voltage reflection coefficient are determined based on complex voltage and current that is obtained at periodic time intervals, such as every 0.1 microsecond (µs) or every 0.2 µs, over a cycle of operation of the X kilohertz RF generator 112 (FIG. 1). For example, the value $\Gamma 11$ is calculated by the processor 126 (FIG. 1) from the complex voltage and current that is measured at 0.1 µs after a positive crossing during a cycle of the RF signal 130 (FIG. 1) and the value $\Gamma 12$ is calculated by the processor 126 (FIG. 1) from the complex voltage and current that is measured at 0.2 µs after the positive crossing during the cycle of the RF signal 130. Similarly, the value $\Gamma n1$ corresponds to the complex voltage and current measured at .n microseconds after the positive crossing of the cycle of the RF signal 130.

In one embodiment, each the values $\Gamma 11$, $\Gamma 21$ through $\Gamma n1$ is an average calculated by the processor 126 over a set of multiple cycles of the RF signal 130. For example, the processor 126 calculates multiple values $\Gamma 11A$, $\Gamma 21A$ through $\Gamma n1A$ of the voltage reflection coefficient from the complex voltage and current measured at the output O2 in the same manner in which the values $\Gamma 11$, $\Gamma 21$ through $\Gamma n1$ are calculated. The value $\Gamma 11A$ is calculated from the complex voltage and current that is measured at 0.1 µs from a time at which a first cycle of the RF signal 130 begins, the value $\Gamma 21A$ is calculated from the complex voltage and current that is measured at 0.1 µs from a time at which a second cycle of the RF signal 130 begins, and so on until the value $\Gamma n1A$ is calculated. The second cycle of the RF signal 130 is consecutive to the first cycle of the RF signal 130. The processor 126 calculates the value $\Gamma 11$ as an average of the values $\Gamma 11A$, $\Gamma 21A$ through $\Gamma n1A$. Similarly, the value $\Gamma n1$ is an average of multiple values of the voltage reflection coefficient and the values of the voltage reflection coefficient are calculated from the complex voltage and current measured at .n µs from a time at which each corresponding cycle of the RF signal 130 begins.

In one embodiment, instead of calculating the values $\Gamma 11$, $\Gamma 21$ through $\Gamma n1$ of the voltage reflection coefficient, measured values of the complex voltage and current over one cycle of the RF signal 130 are used by the processor 126.

Figures 1, 1D, 2:
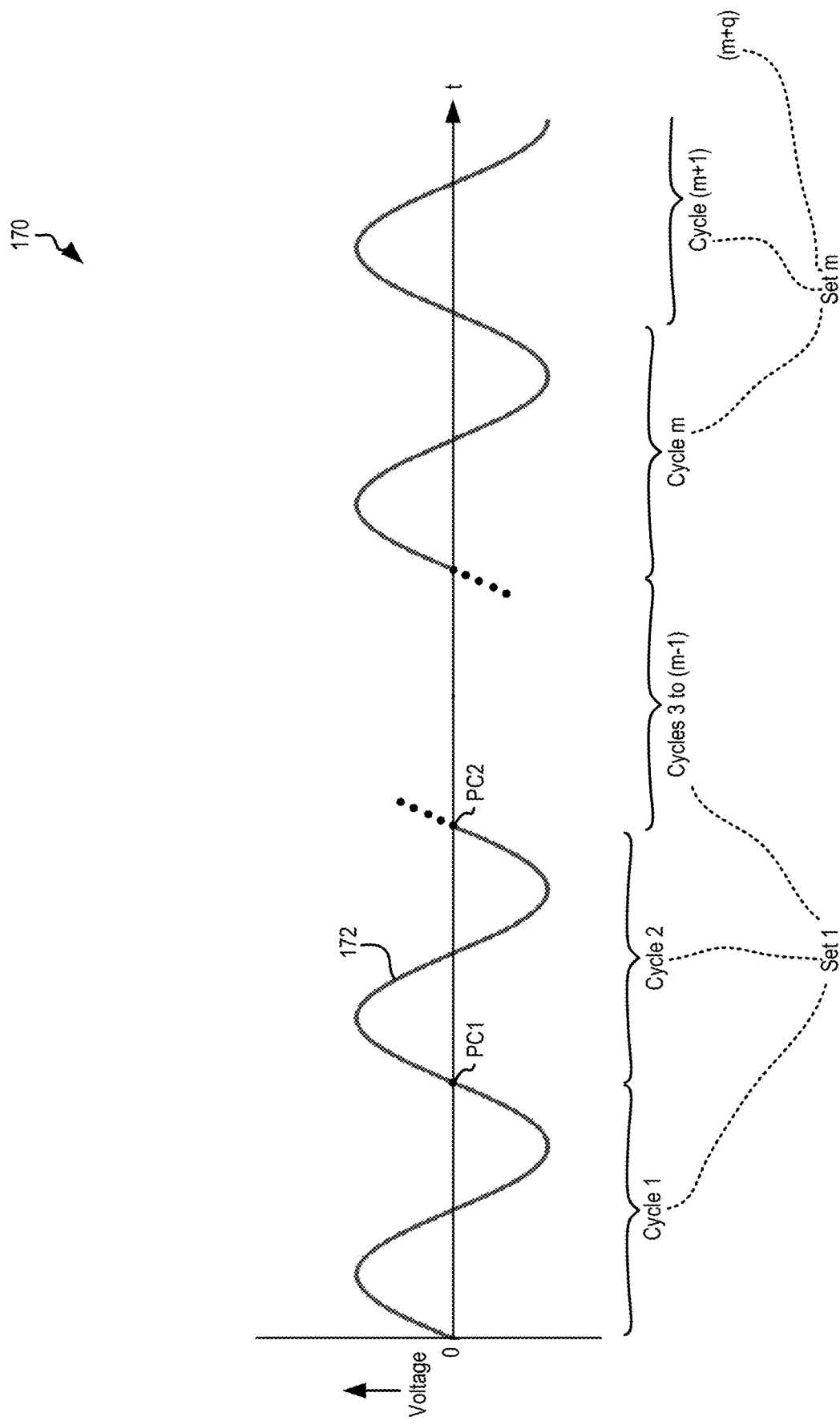

FIG. 1B-2 is an embodiment of a graph 140 to illustrate a correspondence between the values $\Gamma 11$, $\Gamma 21$ through $\Gamma n1$ and time intervals during a cycle 1 of the RF signal 130 (FIG. 1). The graph 140 plots a voltage waveform 142 of the RF signal 130 versus time t. The voltage waveform 142 is a sinusoidal or substantially sinusoidal and oscillates over multiple cycles, such as a cycle 1 and the cycle 2. The cycle 2 is consecutive to the cycle 1. For example, there are no other cycles of the RF signal 130 between the cycles 1 and 2.

The value $\Gamma 11$ corresponds to a time interval between 0 µs and 0.1 µs. At the time of 0.1 µs, the voltage waveform 142 has a positive crossing. Similarly, the value $\Gamma 21$ corresponds to a time interval between 0.1 and 0.2 µs, and so on until the value $\Gamma n1$ corresponds to a time interval between .(n−1) µs and .n µs.

FIG. 1C is a diagram of an embodiment of an RF path model 150 to illustrate calculation of load impedance values ZL11 through ZLn1 from the values $\Gamma 11$, $\Gamma 21$ through $\Gamma n1$ of the voltage reflection coefficient. The RF path model 150 is a computer-based model, which is generated or executed or both generated and executed by the processor 126 from at least a portion of the RF path 102. For example, the RF path model 150 includes multiple circuit elements that are connected in the same manner as circuit components of the portion of the RF path 102 or the RF path 102. Examples of a circuit element include a capacitor, an inductor, and a resistor. Any two adjacent circuit elements of the RF path model 102 are coupled to each other via a connection in the same manner in which the corresponding two adjacent circuit components of the portion of the RF path 102 are coupled with each other. To illustrate, when two capacitors of the RF path 102 are coupled in series with each other, two capacitors of the RF path model 150 are also coupled in series with each other. Each of the two capacitors of the RF path model 150 has the same capacitance as that of a corresponding one of the two capacitors of the RF path 102 or the two capacitors of the RF path model 150 has the same total or combined capacitance as that of a total or combined capacitance of the two capacitors of the RF path 102. As another illustration, when two capacitors of the RF path 102 are coupled in parallel with each other, two capacitors of the RF path model 150 are also coupled in parallel with each other and the two capacitors of the RF path model 150 has the same total or combined capacitance as that of a total or combined capacitance of the two capacitors of the RF path 102.

As yet another illustration, the RF path model 150 has the same impedance or substantially the same impedance as a combined impedance of the circuit components of the portion of the RF path 102 or of the RF path 102. The RF path model 150 has substantially the same impedance as the combined impedance of the circuit components of the portion of the RF path 102 when the impedance of the RF path model 150 is within a predetermined range from the combined impedance. The predetermined range is stored in the memory device 128 and accessed by the processor 126. As an example, the RF path model 150 is received via an input device by the processor 126 and is executed by the processor 126. The RF path model 150 is created by a user who operates the input device 150. The RF path model 150 is created by the user by using a computer program that is executed by the processor 126. As another example, the RF path model 150 is generated by the processor 126 and is executed by the processor 126. As another example, the RF path model 150 includes a number of modules and each module includes one or more resistors, or one or more capacitors, or one or more inductors, or a combination thereof. As an illustration, each module is expressed as an equation that includes a resistance and a reactance.

Examples of the portion of the RF path 102 include the RF cable RFC2 (FIG. 1), or the branch of the impedance matching network 110 (FIG. 1) that is coupled between the input I2 (FIG. 1) of the impedance matching network 110 and the output of the impedance matching network 110, or the RF transmission line RFT1 (FIG. 1), or the plasma excitation electrode 104 (FIG. 1). Additional examples of the portion of the RF path 102 include a combination of the RF cable RFC2 and the branch of the impedance matching network 110 that is coupled between the input I2 of the impedance matching network 110 and the output of the impedance matching network 110, or a combination of the RF cable RFC2 and the branch of the impedance matching network 110 and the RF transmission line RFT1, or a combination of the RF cable RFC2 and the branch of the impedance matching network 110 and the RF transmission line RFT1 and the plasma excitation electrode 104.

The processor 126 provides the values Γ11, Γ21 through Γn1 to an input In of the RF path model 150 to generate the load impedance values ZL11 through ZLn1 at an output Out of the RF path model 150. For example, the processor 126 forward propagates the value Γ11 from the input In via the circuit elements of the RF path model 150 to generate the load impedance value ZL11 at the output Out. Before and during the forward propagation, the RF path model 150 is initialized to have a capacitance Cknown1 and a radio frequency RFknown. The capacitance Cknown1 is a capacitance of a capacitor of the branch of the impedance matching network 110 between the input I2 and the output of the impedance matching network 110 during processing of the substrate S (FIG. 1A) and the radio frequency RFknown is a frequency of operation of the Y megahertz RF generator 114 (FIG. 1A). To illustrate, the radio frequency RFknown is a frequency of operation the Y megahertz RF generator 114. The Y megahertz RF generator 114, as an example, operates between 57 MHz and 63 MHz. To further illustrate, the frequency RFknown is different for each time interval, such as the time interval between 0 and 0.1 µs, the time interval between 0.1 µs and 0.2 µs, etc. The values Cknown1 and RFknown are provided as inputs to the processor 134 by the user via the input device that is connected to the processor 126 via an input/output interface, e.g., a serial interface, a parallel interface, a universal serial bus (USB) interface, etc. Examples of the input device include a mouse, a keyboard, a stylus, a keypad, a button, and a touch screen.

Continuing with the example, the processor 126 determines impedance values Z11, Z21 through Zn1 at the input In of the RF path model 150 from the values Γ11, Γ21 through Γn1. To illustrate, the processor 126 accesses from the memory device 128 a correspondence, such as a mapping or a one-to-one relationship, between the impedance value Z11 and the value Γ11 to identify the impedance values Z11. In a similar manner, impedance values Z21 through Zn1 at the input In of the RF path model 150 are determined by the processor 126 from the values Γ21 through Γn1.

Continuing further with the example, the processor 126 propagates the impedance value Z11 via the circuit elements of the RF path model 150 to calculate the value ZL11 at the output Out of the RF path model 150. To illustrate, the processor 126 calculates a directional sum of the value Z11 and values of the impedances of the circuit elements of the RF path model 150 to calculate the load impedance value ZL11 at the output Out of the RF path model 150. The values of the impedance of the circuit elements are stored in the memory device 128. In a similar manner, the processor 126 determines the load impedance values ZL21 through ZLn1 at the output Out of the RF path model 150 from the impedance values Z21 through Zn1 at the input In of the RF path model 150.

In one embodiment, instead of receiving the values Γ11, Γ21 through Γn1 of the voltage reflection coefficient at the input In of the RF path model 150, values of a complex voltage and current are received at the input In by the RF path model 150 from the sensor 131 and the fast data acquisition device 123 (FIG. 1A) coupled to the output of the Y MHz RF generator 114 (FIG. 1A). In this embodiment, there is no need for the processor 126 to calculate the values Γ11, Γ21 through Γn1 of the voltage reflection coefficient from the values of the complex voltage and current. The values ZL11 through ZLn1 of the load impedance are calculated by the processor 126 by propagating via the RF path model 150 the values of the complex voltage and current that are measured by the sensor 131 and the fast data acquisition device 123. For example, the processor 126 accesses values of impedance or values of complex voltage and current associated with each of the circuit elements of the RF path model 150 from the memory device 128, calculates a directional sum of each of the complex voltage and current values at the input In and the values of impedance or complex voltage and current associated with the circuit elements of the RF path model 150 to compute the values ZL11 through ZLn1 of the load impedance at the output Out of the RF path model 150.

FIG. 1D-1 is a diagram of an embodiment of the RF path model 150 to illustrate a determination of operation parameters, which include frequency parameters or frequency parameters and match network parameters, based on application of the values ZL11 through ZLn1 of the load impedance at the output of the RF path model 150 to minimize an average power reflection coefficient $\Gamma 1avmin^2$ at the input of the RF path model 150. For example, the processor 126 is provided an input via the input device indicating a type of a periodic waveform of the RF signal 132 that is to be output from the Y MHz RF generator 114 (FIG. 1A). To illustrate, the processor 126 is provided an input via the input device and the input includes initial values of the operation parameters described below. The input is provided by the user who is operating the input device. As another illustration, the operation parameters are provided by the user as the input and the processor 126 initializes values of the operation parameters. The type of periodic waveform or the operation parameters define a shape of an envelope of the RF signal 132. For example, the type of periodic waveform or the operation parameters provide a shape of a peak-to-peak amplitude of the RF signal 132. Examples of the type of periodic waveform or the shape of the periodic waveform include a sinusoidal waveform, a trapezoidal waveform, a sawtooth-shaped waveform, a rectangular waveform, and a square-shaped waveform. In this example, the sinusoidal, the trapezoidal, the rectangular, the sawtooth-shaped, and the square-shape are shapes of an envelope of the RF signal 132. Sometimes, the terms periodic waveform and periodic function are used herein interchangeably. A power reflection coefficient is another example of the reflection parameter or of the reflection coefficient parameter.

Continuing with the example, the values ZL11 through ZLn1 of the load impedance at the output of the RF path model 150 are backpropagated via the circuit elements of the RF path model 150 to determine multiple values ZL1a through ZLna of load impedance at the input of the RF path model 150. The processor 126 calculates a directional sum of the value ZL11 and of values of impedance of the circuit elements of the RF path model to determine the value ZL1a and calculates a directional sum of the value ZL21 and of the values of impedance of the circuit elements of the RF path model 150 to determine the value ZL2a. In a similar manner, the value ZLna is determined by the processor 126 from the value ZLn1.

Continuing with the example, the processor 126 determines values $\Gamma 1a^2$ through $\Gamma na^2$ of a power reflection coefficient at the input of the RF path model 150 from the values ZL1a through ZLna of the load impedance at the input of the RF path model 150. For example, the processor 126 accesses from the memory device 126 a correspondence, such as a mapping or a linking, between the values Γ1a through Γna of the voltage reflection coefficient and the values ZL1a through ZLna of the load impedance to identify or determine the values Γ1a through Γna of the voltage reflection coefficient. To illustrate, the memory device 126 stores a correspondence between the value Γ1*a* and the value ZL1*a* and stores another correspondence between the value Γn*a* and the value ZLn*a*.

Continuing further with the example, the processor 126 calculates squares of each of the values Γ1*a* through Γn*a* of the voltage reflection coefficient at the input of the RF path model 150 to determine values Γ1$a^2$ through Γn$a^2$ of the power reflection coefficient at the input In of the RF path model 150. The processor 126 further calculates an average of the values Γ1$a^2$ through Γn$a^2$ of the power reflection coefficient to generate a first average value ΓAavmin$^2$. The processor 126 determines values, such as yMHzavfreqA, yMHzfreqvariationA, thighA, tlowA, ϕrelativeA, and CA, of the operation parameters for which the first average value ΓAavmin$^2$ is calculated, where yMHzavfreqA is an average frequency of operation at which the Y megahertz RF generator 114 is to be operated, yMHzfreqvariationA is a variation in the average frequency, thighA is a high dwell time for which a power level or a voltage level of the Y megahertz RF generator 114 is to remain at a high level, tlowA is a low dwell time for which a power level or a voltage level of the Y megahertz RF generator 114 is to remain at a low level, ϕrelativeA is a relative phase of the RF signal 132 (FIG. 1A) to be output by the Y megahertz RF generator 114 compared to the phase of the RF signal 130 (FIG. 1A) output by the X kilohertz RF generator 112, and CA is a total capacitance to be applied to the branch of the impedance matching network 110 (FIG. 1A) that is coupled between the input I2 of the impedance matching network 110 and the output of the impedance matching network 110. The low level is a voltage or power level that is lower than a voltage or power level corresponding to the high level. The high level is sometimes referred to herein as a high state and the low level is sometimes referred to herein as a low state. Also, the low level is a bottom envelope or a bottom boundary of multiple values of an RF signal and the high level is a top envelope or a top boundary of multiple values of the RF signal. The RF signal oscillates between the low level and the high level.

To illustrate the determination of the values, such as yMHzavfreqA, yMHzfreqvariationA, thighA, tlowA, ϕrelativeA, and CA, of the operation parameters, the processor 126 provides the values of the operation parameters to the RF path model 150. By providing the values to the RF path model 150, the processor 126 makes the values available to the RF path model 150. Once the RF path model 150 has received the values of the operation parameters from the processor 126 to be characterized by the values, the processor 126 backpropagates the values ZL11 through ZLn1 of the load impedance at the output of the RF path model 150 to determine the values Γ1*a* through Γn*a* of the voltage reflection coefficient at the input of the RF path model 150. The processor 126 accesses the values of the operation parameters from the memory device 126 and makes the values available to, e.g., provides the values to, the RF path model 150 for which the values Γ1*a* through Γn*a* of the voltage reflection coefficient are determined.

Continuing with the example, the values ZL11 through ZLn1 of the load impedance at the output of the RF path model 150 are backpropagated via the circuit elements of the RF path model 150 to determine multiple values ZL1*x* through ZLn*x* of load impedance at the input of the RF path model 150. The processor 126 calculates a directional sum of the value ZL11 and of values of impedance of the circuit elements of the RF path model 150 to determine the value ZL1*x* and calculates a directional sum of the value ZL21 and of values of impedance of the circuit elements of the RF path model 150 to determine the value ZL2*x*. In a similar manner, the value ZLn*x* is determined by the processor 126 from the value ZLn1.

Continuing with the example, the processor 126 calculates values Γ11$^2$ through Γn1$^2$ of a power reflection coefficient at the input of the RF path model 150 from the values ZL1*x* through ZLn*x* of load impedance at the input of the RF path model 150. For example, the processor 126 accesses from the memory device 126 a correspondence, such as a mapping or a linking, between the values Γ11 through Γn1 of the voltage reflection coefficient and the values ZL1*x* through ZLn*x* of the load impedance to identify or determine the values Γ11 through Γn1 of the voltage reflection coefficient. To illustrate, the memory device 126 stores a correspondence between the value Γ11 and the value ZL1*x* and stores another correspondence between the value Γn1 and the values ZLn*x*.

Continuing further with the example, the processor 126 calculates squares of each of the values Γ11 through Γn1 of the voltage reflection coefficient at the input of the RF path model 150 to determine values Γ11$^2$ through Γn1$^2$ of the power reflection coefficient at the input of the RF path model 150. The processor 126 further calculates an average of the values Γ11$^2$ through Γn1$^2$ of the power reflection coefficient to generate a second average value Γ1*av*min$^2$.

The processor 126 determines values, such as yMHzavfreq1, yMHzfreqvariation1, thigh1, tlow1, ϕrelative1, and C1, of the operation parameters for which the first average value Γ1*av*min$^2$ is calculated, where yMHzavfreq1 is an average frequency of operation at which the Y megahertz RF generator 114 is to be operated, yMHzfreqvariation1 is a variation in the average frequency, thigh1 is a high dwell time for which a power level or a voltage level of the Y megahertz RF generator 114 is to remain at a high level, tlow1 is a low dwell time for which a power level or a voltage level of the Y megahertz RF generator 114 is to remain at a low level, ϕrelative1 is a relative phase of the RF signal 132 (FIG. 1A) to be output by the Y megahertz RF generator 114 compared to the phase of the RF signal 130 (FIG. 1A) output by the X kilohertz RF generator 112, and C1 is a total, such as combined, capacitance of the branch of the impedance matching network 110 (FIG. 1A) between the input I2 (FIG. 1A) of the impedance matching network 110 and the output of the impedance matching network 110. To illustrate the determination of the values, such as yMHzavfreq1, yMHzfreqvariation1, thigh1, tlow1, ϕrelative1, and C1, of the operation parameters, the processor 126 provides the values of the operation parameters to the RF path model 150. By providing the values to the RF path model 150, the processor 126 makes the values available to the RF path model 150. Once the RF path model 150 has received the values of the operation parameters from the processor 126 to be characterized by the values, the processor 126 backpropagates the values ZL11 through ZLn1 of the load impedance at the output of the RF path model 150 to determine the values Γ11 through Γn1 of the voltage reflection coefficient at the input of the RF path model 150. The processor 126 accesses the values of the operation parameters from the memory device 126 and makes the values available to, e.g., provides the values to, the RF path model 150 for which the values Γ11 through Γn1 of the voltage reflection coefficient are determined.

The processor 126 determines that the second average value Γ1*av*min$^2$ of power reflection coefficient at the input of the RF path model 150 is less than or lower than the first average value ΓAavmin$^2$ of the power reflection coefficient at the input of the RF path model 150. In response to the determination, the processor 126 determines to apply the frequency parameters yMHzavfreq1, yMHzfreqvariation1, thigh1, tlow1, ϕrelative1 instead of applying the yMHzavfreqA, yMHzfreqvariationA, thighA, tlowA, ϕrelativeA to the Y megahertz RF generator 114 and determines to apply the match network parameter C1 instead of applying the match network parameter CA to the impedance matching network 110. Once the processor 126 determines the values yMHzavfreq1, yMHzfreqvariation1, thigh1, tlow1, ϕrelative1, and C1, the processor 126 updates the initial values of the operation parameters with the determined values yMHzavfreq1, yMHzfreqvariation1, thigh1, tlow1, ϕrelative1, and C1 of the operation parameters.

The determined values yMHzavfreq1, yMHzfreqvariation1, thigh1, tlow1, ϕrelative1, and C1 of the operation parameters are applied during a next set of one or more cycles of operation of the X kilohertz RF generator 112 and the next set is subsequent to, such as follows, a set of one or more cycles of operation of the X kilohertz RF generator 112 for which the operation parameters to be applied are determined by the processor 126. For example, the processor 126 receives the complex voltage and current measured at the output O2 (FIG. 1A) of the Y megahertz RF generator 114 for 10 cycles of operation of the X kilohertz RF generator 112, determines the operation parameters from the complex voltage and current, and applies the operation parameters to the Y MHz RF generator 114 during the subsequent 10 cycles of operation of the X kilohertz RF generator 112. The subsequent 10 cycles occur after an amount of time taken by the processor 126 to determine the operation parameters. An example of the amount of time includes a portion of the 10 cycles of operation of the X kilohertz RF generator 112 and one or more cycles consecutive to the 10 cycles of operation of the X kilohertz RF generator 112. The one or more consecutive cycles are of operation of the X kilohertz RF generator 112. The processor 126 stores the values, such as the values yMHzavfreq1, yMHzfreqvariation1, thigh1, tlow1, ϕrelative1, and C1, of the operation parameters in the memory device 128.

In one embodiment, the processor 126 repeats the operations or methods of determining the operation parameters until values of the operation parameters converge to be within a predetermined range. For example, during 10 cycles that are subsequent to the 10 cycles for which the values yMHzavfreq1, yMHzfreqvariation1, thigh1, tlow1, ϕrelative1, and C1 of the operation parameters are determined, the processor 126 controls the Y megahertz RF generator 114 to apply the values yMHzavfreq1, yMHzfreqvariation1, thigh1, tlow1, ϕrelative1, and controls one or more variable capacitors of the branch of the impedance matching network 110 between the input I2 (FIG. 1A) and the output of the impedance matching network 110 to apply the value C1. During 10 cycles that are subsequent to the 10 cycles for which the values yMHzavfreq1, yMHzfreqvariation1, thigh1, tlow1, ϕrelative1, and C1 of the operation parameters are applied or during the same 10 cycles during which the values yMHzavfreq1, yMHzfreqvariation1, thigh1, tlow1, ϕrelative1, and C1 of the operation parameters are applied, the processor 126 determines values yMHzavfreqVAL1, yMHzfreqvariationVAL1, thighVAL1, tlowVAL1, ϕrelativeVAL1, and CVAL1 of the operation parameters in the same manner in which the values yMHzavfreq1, yMHzfreqvariation1, thigh1, tlow1, ϕrelative1, and C1 are determined except that the processor 126 initiates the RF path model 150 to have a radiofrequency that is a directional sum of the values yMHzavfreq1 and yMHzfreqvariation1 and to have the capacitance C1. The processor 126 determines whether the value yMHzavfreqVAL1 is within a predetermined range from the value yMHzavfreq1 or that the value yMHzfreqvariationVAL1 is within a predetermined range from the value yMHzfreqvariation1 and so on for the remaining values thighVAL1, tlowVAL1, ϕrelativeVAL1, and CVAL1 and thigh1, tlow1, ϕrelative1, and C1. Upon determining that the value yMHzavfreqVAL1 is within the predetermined range from the value yMHzavfreq1 and that the value yMHzfreqvariationVAL1 is within the predetermined range from the value yMHzfreqvariation1 and so on for the remaining values thighVAL1, tlowVAL1, ϕrelativeVAL1, and CVAL1 and thigh1, tlow1, ϕrelative1, and C1, the processor 126 determines convergence of the values of the operations parameters, and does not further determine values of the operation parameters.

Continuing with the embodiment, on the other hand, upon determining that the value yMHzavfreqVAL1 is not within the predetermined range from the value yMHzavfreq1 or that the value yMHzfreqvariationVAL1 is not within the predetermined range from the value yMHzfreqvariation1 and so on for the remaining values thighVAL1, tlowVAL1, ϕrelativeVAL1, and CVAL1 and thigh1, tlow1, ϕrelative1, and C1, the processor 126 continues to apply the operations and methods to determine further values of the operation parameters during further cycles of operation of the X kilohertz RF generator 112. The processor 126 applies the values yMHzavfreqVAL1, yMHzfreqvariationVAL1, thighVAL1, tlowVAL1, ϕrelativeVAL1, and CVAL1 during the next 10 cycles that are subsequent to the 10 cycles for which the values yMHzavfreqVAL1, yMHzfreqvariationVAL1, thighVAL1, tlowVAL1, ϕrelativeVAL1, and CVAL1 are determined in the same manner in which the processor 126 applies the values yMHzavfreq1, yMHzfreqvariation1, thigh1, tlow1, ϕrelative1, and C1 of the operation parameters, as described below with reference to FIG. 1D-3.

It should be noted that the values yMHzavfreq1, yMHzfreqvariation1, thigh1, tlow1, ϕrelative1 of the operation parameters are for the trapezoidal waveform. In one embodiment, different types of values are calculated for another type of waveform that is to be output by a Y megahertz RF generator, described herein, after applying the methods described herein. For example, when the type of waveform is sinusoidal, the operation parameters include an average frequency, a frequency variation, such as a frequency amplitude, from the average frequency, a period that is the same as that of an RF signal generated by an X kHz RF generator described herein, and a phase relative to a phase of the RF signal generated by the X kHz RF generator. As another example, when the type of waveform is rectangular, the operation parameters include a high frequency value, a high frequency time for which the high frequency value is maintained, a low frequency value, a low frequency time for which the low frequency value is maintained, a period that is the same as that of an RF signal generated by an X kHz RF generator described herein, and a phase relative to a phase of the RF signal generated by the X kHz RF generator. The high frequency value is greater than the low frequency value. As yet another example, when the type of waveform is triangular, the operation parameters include a high frequency value, a low frequency value, a first ramp rate or a first ramp time between the high frequency value and the low frequency value, a second ramp rate or a second ramp time between the low frequency value and the high frequency value, a period that is the same as that of an RF signal generated by an X kHz RF generator described herein, and a phase relative to a phase of the RF signal generated by the X kHz RF generator. The high frequency value is greater than the low frequency value. The first ramp rate is lower than, the same as, or greater than the second rate.

In one embodiment, the match network parameter C1 is not determined by the processor 126 and the determination of the match network parameter C1 is optional.

In an embodiment, the terms frequency parameters and frequency modulation parameters are used herein interchangeably.

FIG. 1D-2 is an embodiment of a graph 170 to illustrate multiple cycles of an RF signal 172 that is generated by an X kilohertz RF generator, described herein. For example, the RF signal 172 is an example of the RF signal 130 of FIG. 1A. The graph 170 plots a voltage of the RF signal 172 versus time t. The RF signal 172 is a voltage waveform representing a voltage that is output by the X kilohertz RF generator. The RF signal 172 is sinusoidal or substantially sinusoidal and oscillates between positive and negative values of voltage in a periodic manner. For example, the RF signal 172 has a positive crossing PC1, which is a time at which values of the voltage waveform become positive from negative. Similarly, after a time period, the RF signal 172 has another positive crossing PC2, which is another time at which values of the voltage waveform become positive from negative.

A cycle 1 of the RF signal 172 represents a time period of occurrence of the voltage waveform. Another cycle 2 of the RF signal 172 represents another instance of the time period of occurrence of the voltage waveform. The cycle 2 is consecutive to the cycle 1. For example, there are no cycles between the cycles 1 and 2. Also, additional cycles 3 through (m−1) of the RF signal 172 follow the cycle 2. The cycle 3 is consecutive to the cycle 2. The cycles 1 through (m−1) form a set 1 of cycles of the RF signal 172, where m is an integer greater than two.

Moreover, cycles m, (m+1), and so on until (m+q) form a set 2 of cycles of the RF signal 172, where q is an integer greater than one. The set 2 is consecutive to the set 1. For example, there is no set of cycles between the sets 1 and 2. The number of cycles from m through (m+q) of the same as the number of cycles from 1 through (m−1) of the set 1. As an example, the ten cycles described above during which the complex voltage and current is measured at the output O2 of the Y megahertz RF generator 114 (FIG. 1A) to determine the values yMHzavfreq1, yMHzfreqvariation1, thigh1, tlow1, ϕrelative1, and C1 of the operation parameters is an example of the cycles 1 through (m−1) of the set 1. Also, the following 10 cycles described above during which the values yMHzavfreq1, yMHzfreqvariation1, thigh1, tlow1, ϕrelative1, and C1 of the operation parameters are applied is an example of the cycles m through (m+q) of the set 2.

In one embodiment, instead of the voltage waveform, a power waveform of the RF signal 172 is used.

FIG. 1D-3 is a diagram of an embodiment of a system 180, such as a plasma tool, to apply the values yMHzavfreq1, yMHzfreqvariation1, thigh1, tlow1, ϕrelative1, and C1 of the operation parameters during the set 2 of cycles of operation of the X kilohertz RF generator 112 during processing of the substrate S. The system 180 is the same as the system 100 in structure and function except that the system 180 excludes the fast data acquisition device 123, the sensor 131 and the fast data acquisition device 121, and includes a voltage sensor 182, a comparator 184, a motor system 186 and a driver system 188. An example of the comparator 184 includes a processor or an application specific integrated circuit or a programmable logic device.

An example of the motor system 186 includes one or more electric motors, and each electric motor has a stator and a rotor. An example of the driver system 188 includes one or more transistors that are coupled to each other to output one or more current signals upon receiving one or more signals from the motor system 186. The comparator 184 is coupled to the voltage sensor 182 and is also coupled to the processor 126. The voltage sensor 182 is coupled to the output O1 of the X kilohertz RF generator 112.

The driver system 188 is coupled to the processor 126, and the motor system 186 is coupled to the driver system 188. The motor system 186 is coupled to the one or more circuit components of the impedance matching network 110 via corresponding one or more connection components. An example of each connection component includes one or more rods, or a combination of one or more rods and one or more gears.

The RF signal 130 is generated by the X kilohertz RF generator 112 in a manner similar to that described above with reference to FIG. 1A and sent via the output O1 of the X kilohertz RF generator 112 and the RF cable RFC 1 to the input I1 of the impedance matching network 110. For example, the set 2 of cycles of the RF signal 130 is output from the X kilohertz RF generator 112. The voltage sensor 182 measures a voltage of the RF signal 130 at the output O1 of the X kilohertz RF generator 112. The comparator 184 compares the voltage measured by the voltage sensor 182 with a value of zero to output comparison results and provides the comparison results to the processor 126. The comparison results provide whether the voltage is above or below zero or at zero, such as for example whether the voltage is positive or negative or zero. The processor 126 determines from the comparison results multiple times or multiple instances at which the voltage is zero and is about to become positive from being negative. Based on the multiple times or multiple instances that are determined by the processor 126, the phase of the RF signal 130 is determined by the processor 126.

Moreover, the processor 126 accesses the values yMHzavfreq1, yMHzfreqvariation1, thigh1, tlow1, ϕrelative1 of the frequency parameters from the memory device 128 and provides the values to the RF power supply 124. The relative phase ϕrelative1 is determined by the processor 126 from the phase of the RF signal 130 that is determined during processing of the substrate S. Upon receiving the frequency parameters, the RF power supply 124 generates an RF signal 190 having the values yMHzavfreq1, yMHzfreqvariation1, thigh1, tlow1, and ϕrelative1. For example, the RF signal 190 has an envelope or a peak-to-peak amplitude that is of a trapezoidal shape or a pulse shape or a square wave shape or a sinusoidal shape. The relative phase ϕrelative1 of the RF signal 190 is relative to, such as lags, the phase of the RF signal 130 that is determined using the voltage sensor 182, the comparator 184 and the processor 126. The RF signal 190 is itself a sinusoidal signal or a substantially sinusoidal signal. The RF signal 190 is supplied by the RF power supply 124 via the output O2 and the RF cable RFC 2 to the input I2 of the impedance matching network 110.

Moreover, the processor 126 accesses the value C1 from the memory device 128, generates an instruction signal, and sends the instruction signal to the driver system 188. An example of the instruction signal is one that includes one or more amounts of current to be output by the driver system 188 to control the motor system 186 to achieve a combined capacitance of a branch of the impedance matching network 110 between the input I2 and the output of the impedance matching network 110. Upon receiving the instruction signal, the driver system 186 generates one or more current signals and sends the current signals to the motor system 186.

The motor system 186 is operated according to the one or more current signals and controls one or more variable capacitors of the branch between the input I2 and the output of the impedance matching network 110 to achieve the capacitance C1 of the branch of the impedance matching network 110. For example, a motor of the motor system 186 operates to rotate or move in a linear direction a plate of a variable capacitor in the impedance matching network 110 to change a distance or an area between the plate and another plate of the capacitor to change a capacitance of the capacitor to achieve the capacitance C1 of the branch between the input I2 and the output of the impedance matching network 110.

The impedance matching network 110, which has the capacitance C1, receives the RF signals 130 and 190, and processes the RF signals 130 and 190 in the manner described above with respect to the RF signals 130 and 132 (FIG. 1A) to output a modified RF signal 192. For example, the impedance matching network 110 matches an impedance of the load that is coupled to the output of impedance matching network 110 with that of the source that is coupled to the inputs I1 and I2 of the impedance matching network 110 to output the modified RF signal 192. When one or more process gases are supplied to the gap between the upper electrode 106 and the lower electrode of the plasma excitation electrode 104, and the lower electrode of the plasma excitation electrode 104 receives the modified RF signal 192 via the RF transmission line RFT1 from the output of impedance matching network 110, plasma is stricken or maintained within the plasma chamber 108 to process the substrate S during the set 2 of cycles of operation of the X kilohertz RF generator 112. An example of a process gas includes an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc.

In one embodiment, the comparator 184 is a portion of the processor 126 and functions described herein as being performed by the comparator 184 are performed by the processor 126.

In the embodiment in which the capacitance C1 is not determined, the processor 126 does not control the impedance matching network 110 to achieve the capacitance C1.

In one embodiment, the sensor 120 (FIG. 1A) is decoupled from the output O1 of the X kilohertz RF generator 112 after the values yMHzavfreq1, yMHzfreqvariation1, thigh1, tlow1, ϕrelative1, and C1 of the operation parameters are determined or are determined after convergence by the processor 126. Also, the sensor 131 is decoupled from the output O2 of the Y megahertz RF generator 114.

Figure 2A:
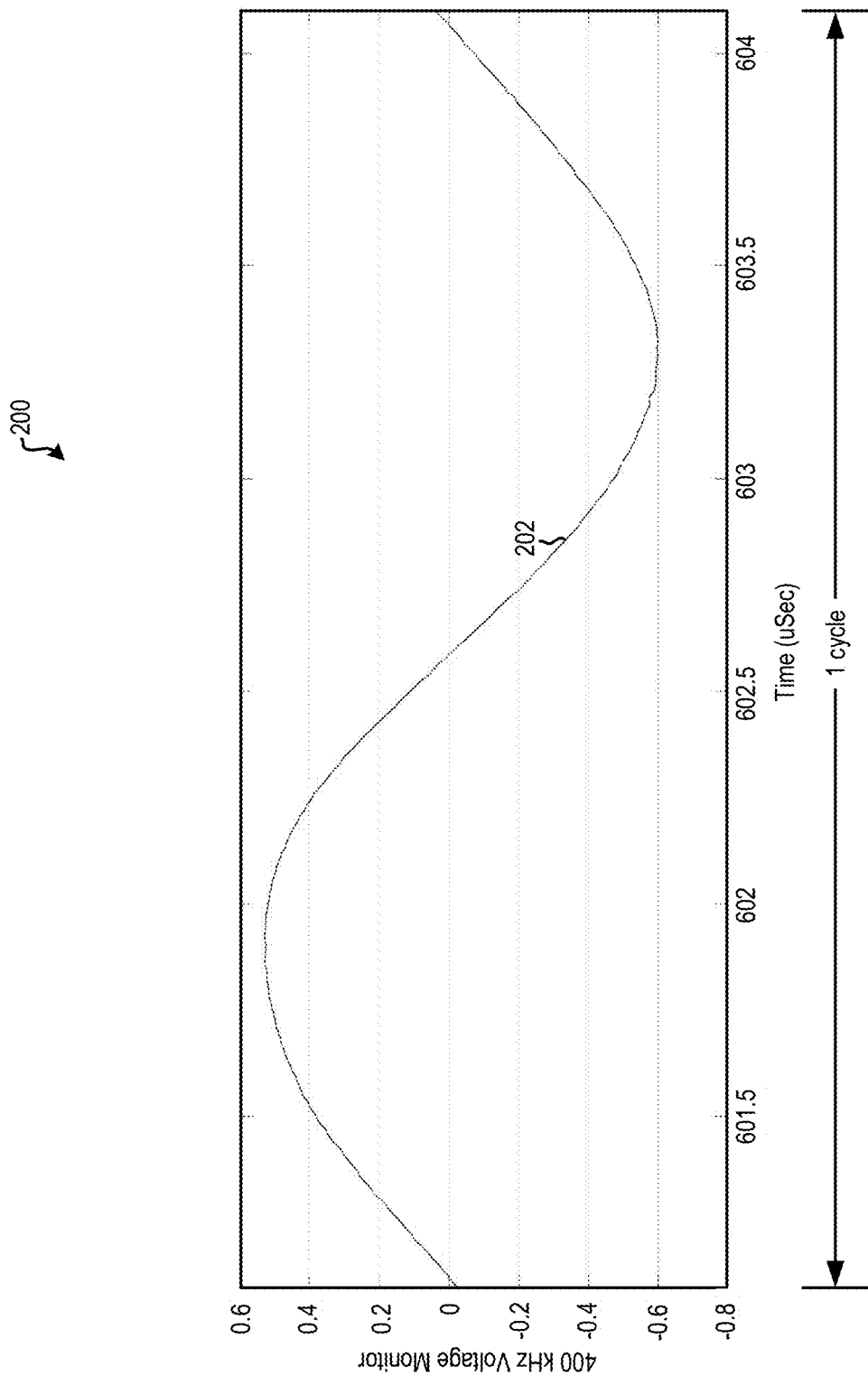
FIG. 2A is an embodiment of a graph to illustrate a cycle of an RF signal.

FIG. 2A is an embodiment of a graph 200 to illustrate a cycle of operation of an RF signal 202. The RF signal 202 is an example of the RF signal 130 of FIG. 1A. The graph 200 plots a voltage of the RF signal 130 versus the time t in microseconds.

Figure 2B:
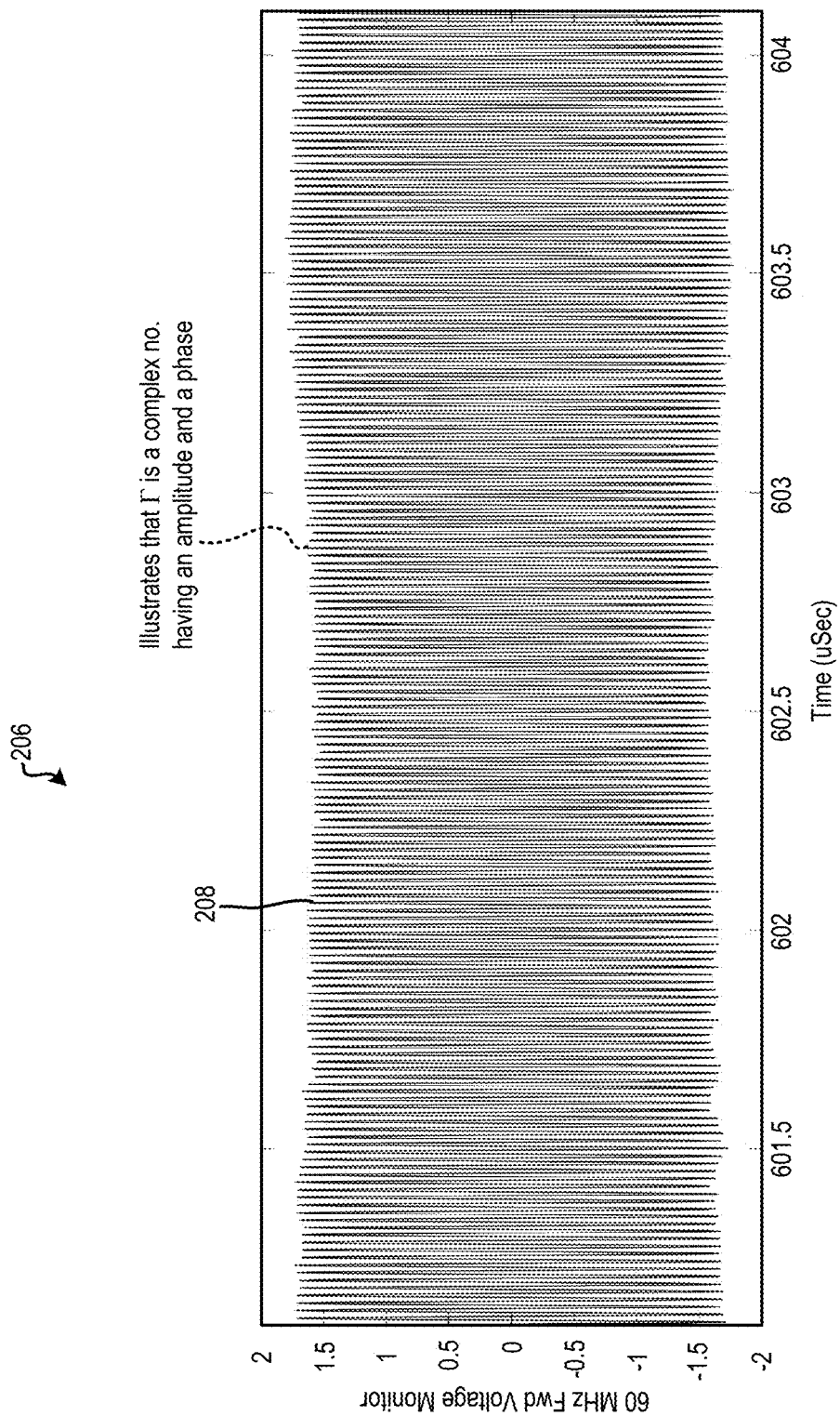
FIG. 2B is an embodiment of a graph to illustrate a forward voltage waveform of an RF signal that is supplied by a Y megahertz (MHz) RF generator.

FIG. 2B is an embodiment of a graph 206 to illustrate a forward voltage waveform 208 of an RF signal that is supplied by a Y MHz RF generator, described herein. For example, the forward voltage waveform 208 is an example of a forward voltage of the RF signal 132 of FIG. 1A. The graph 206 plots a forward voltage or voltage supplied at an output of the Y MHz RF generator versus the time t in microseconds during one cycle of the RF signal 202 (FIG. 2A). It should be noted that the forward voltage waveform 208 has multiple cycles during one cycle of the RF signal 202 that is supplied by the X kilohertz RF generator, described above with reference to FIG. 2A.

Figure 2C:
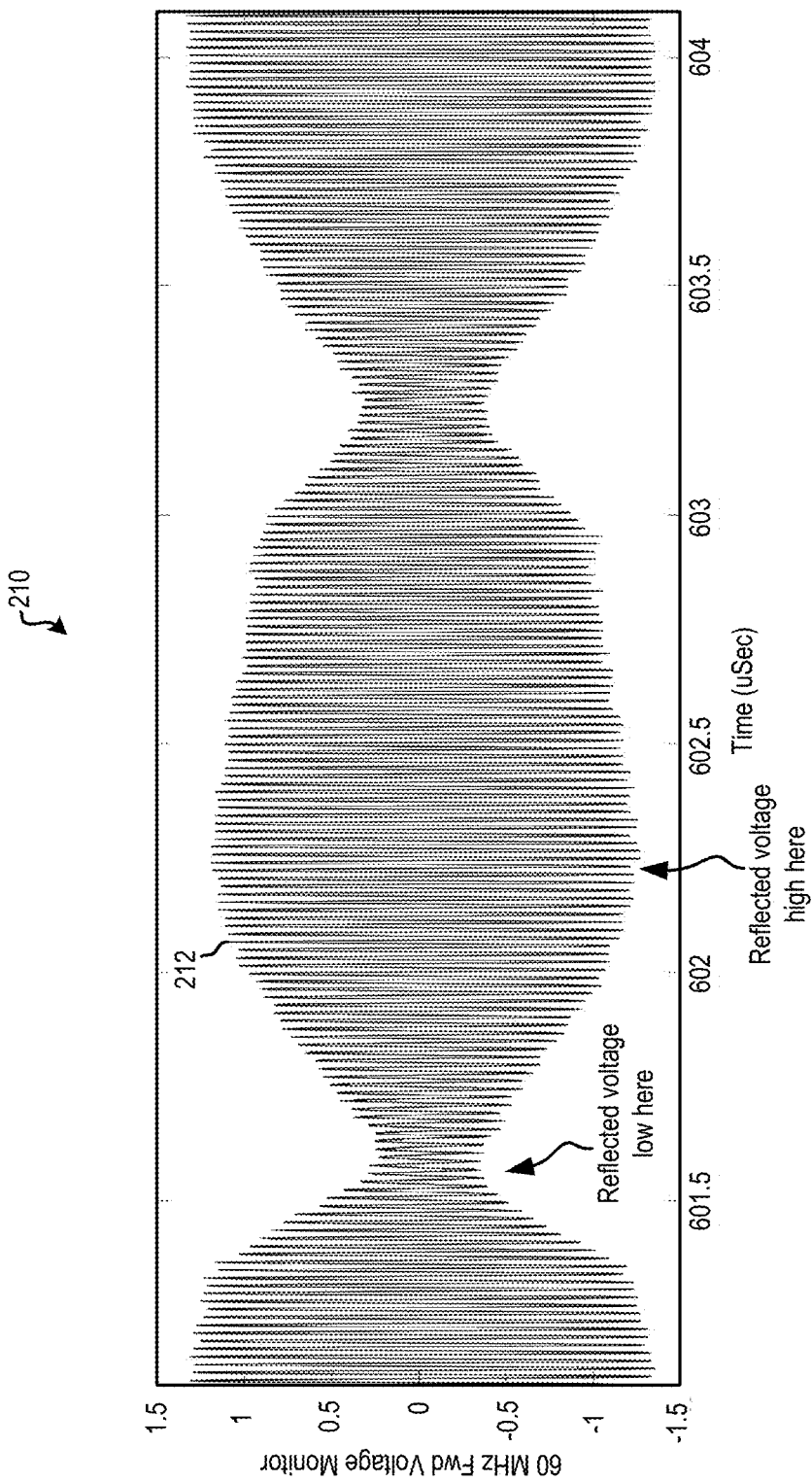
FIG. 2C is an embodiment of a graph to illustrate a reverse voltage waveform of the RF signal that is supplied by the Y MHz RF generator.

FIG. 2C is an embodiment of a graph 210 to illustrate a reverse voltage waveform 212 of an RF signal that is supplied by the Y MHz RF generator, described herein. For example, the reverse voltage waveform 212 is an example of a reverse voltage of the RF signal 132 of FIG. 1A. The graph 210 plots a reverse voltage or voltage reflected towards an output of the RF generator versus the time t in microseconds during one cycle of the RF signal 202 (FIG. 2A). It should be noted that the reverse voltage waveform 212 has multiple cycles during one cycle of the RF signal 202 that is supplied by the X kilohertz RF generator, described above with reference to FIG. 2A.

From the forward voltage waveform 208 of FIG. 2B and the reverse voltage waveform 212 of FIG. 2C, it is illustrated that a voltage reflection coefficient is a complex number having an amplitude and phase. The forward voltage has similar peak-to-peak amplitudes or a substantially constant envelope. A peak-to-peak amplitude or an envelope of the reverse voltage becomes low periodically and becomes high periodically. The forward voltage and the reverse voltage together create the complex number of the voltage reflection coefficient. A complex number includes an amplitude and a phase.

Figure 2D:
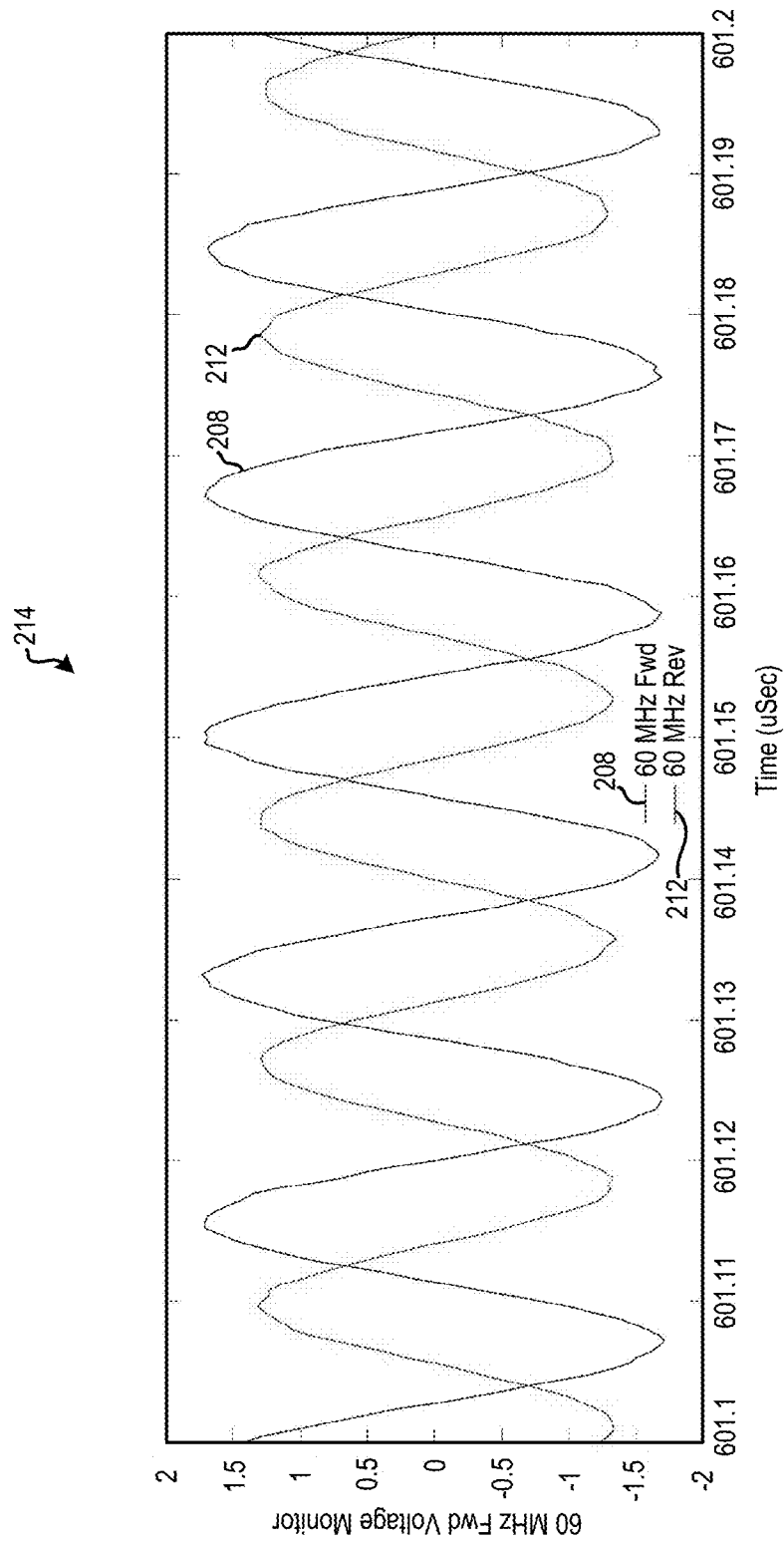
FIG. 2D is a diagram of an embodiment of a graph to illustrate the forward voltage waveform and the reverse voltage waveform in one graph.

FIG. 2D is a diagram of an embodiment of a graph 214 to illustrate the forward voltage waveform 208 and the reverse voltage waveform 212 in one graph. Again, the forward voltage waveform 208 and a change in the peak-to-peak amplitude of the reverse voltage waveform 212 create the complex number of the voltage reflection coefficient.

Figure 2E:
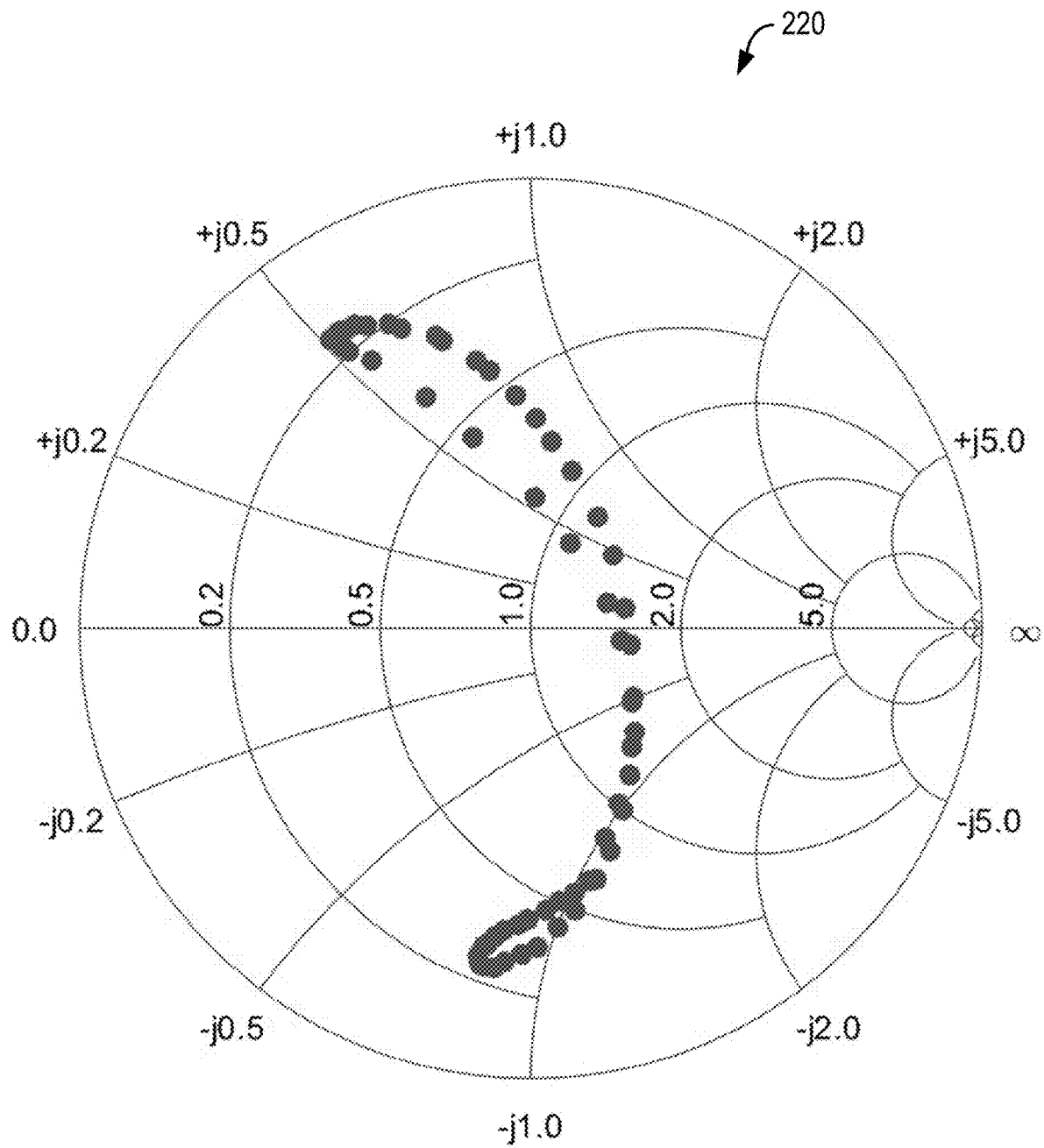
FIG. 2E is an embodiment of a Smith chart to illustrate values of a voltage reflection coefficient at an output of a Y MHz RF generator before applying the methods described herein.

FIG. 2E is an embodiment of a Smith chart 220 to illustrate values of a voltage reflection coefficient at an output of a Y MHz RF generator, described herein. For example, the Smith chart 220 illustrate values of the voltage reflection coefficient at the output O2 of the Y MHz RF generator 114 (FIG. 1A) when the methods described herein are not applied for one cycle of operation of the X kilohertz RF generator 112 (FIG. 1A). For example, as shown in FIG. 2E, most values of the voltage reflection coefficient are not close to a center of the Smith chart 220. Accordingly, without applying the methods described herein, a high amount of voltage is reflected towards the Y megahertz RF generator.

Figure 3A:
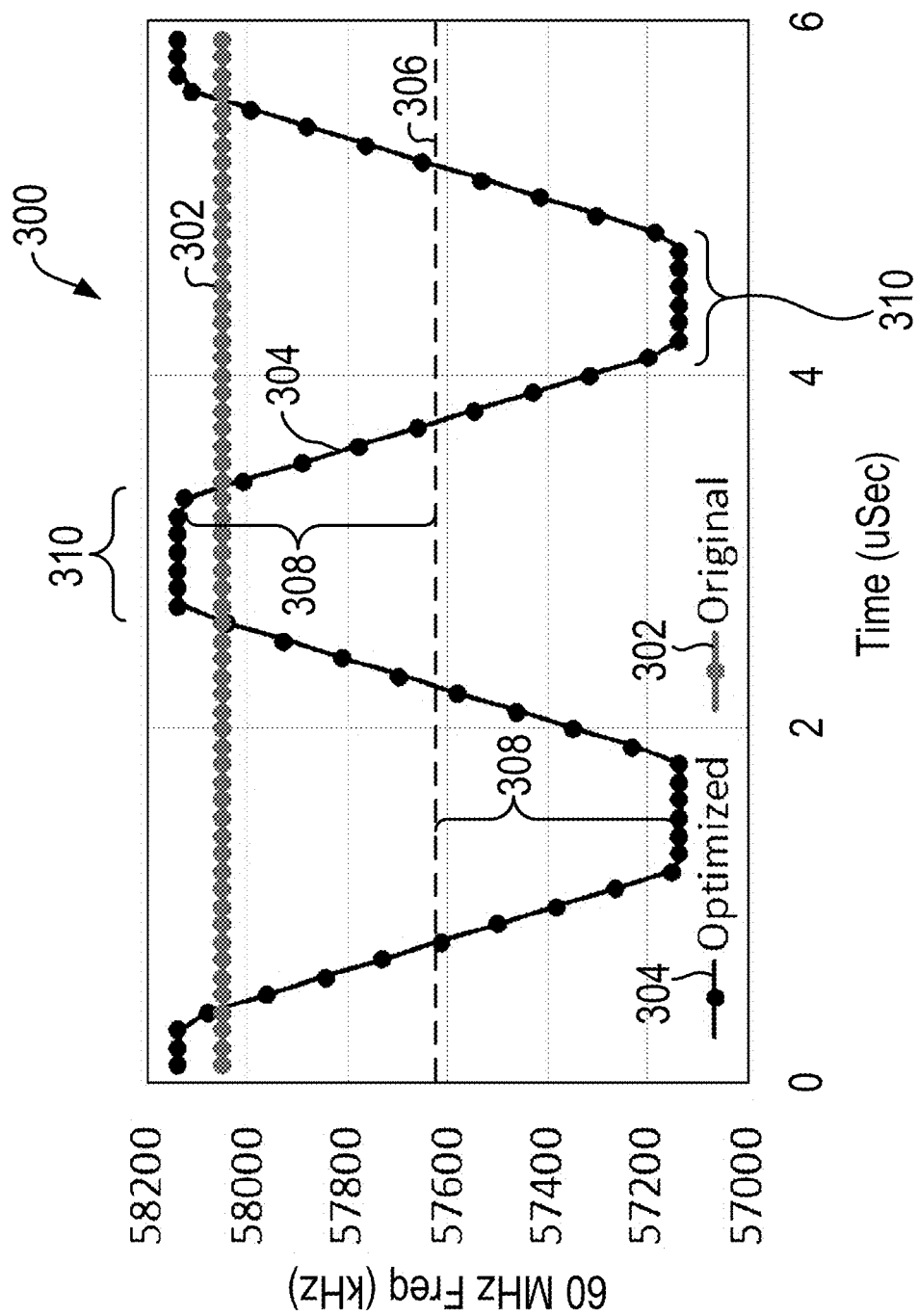
FIG. 3A is a diagram of an embodiment of a graph to illustrate a comparison between a frequency of an RF signal that is output from a Y megahertz RF generator after applying the methods described herein and an RF signal that is output from the Y megahertz RF generator before applying the methods.

FIG. 3A is a diagram of an embodiment of a graph 300 to illustrate a comparison between a frequency of an RF signal that is output from a Y megahertz RF generator, described herein, after applying the methods described herein and an RF signal that is output from the Y megahertz RF generator before applying the methods. The graph 300 plots a frequency 302 of an RF signal and another frequency 304 of another RF signal versus the time t in microseconds. The frequency 302 is of the RF signal that is output by the Y megahertz RF generator before applying the methods described herein and the frequency 304 is of the RF signal that is output by the Y megahertz RF generator after applying the method.

The frequency 304 is an example of a frequency of the RF signal 190 (FIG. 1D-3) after applying the methods described herein and the frequency 302 is a frequency of the RF signal 132 before applying the methods. The frequency 302 is a frequency of an envelope or a peak-to-peak amplitude of an RF signal that is output from the Y megahertz RF generator and the frequency 304 is a frequency of another envelope or a peak-to-peak amplitude of an RF signal output from the Y megahertz RF generator. As illustrated, the envelope of the RF signal illustrated by the frequency 302 is substantially constant or substantially the same. On the other hand, the envelope of the RF signal illustrated by the frequency 304 has a trapezoidal shape.

The graph 300 also illustrates the frequency parameters of the RF signal output from the Y megahertz RF generator after applying the methods described herein. For example, a frequency parameter 306 is an example of the value yMHzavfreq1. To illustrate, the frequency parameter 306 is an average frequency of the RF signal 190 during a cycle or a set of cycles of the X MHz RF generator 112. As another example, a frequency parameter 308 is an example of the value yMHzfreqvariation1. To illustrate, the frequency parameter 308 is a value of a variation in a positive direction or a negative direction from the average frequency of the RF signal output from the Y megahertz RF generator after applying the methods described herein. The positive direction is a direction in which voltage values of the RF signal output from the Y megahertz RF generator are positive compared to the average frequency yMHzavfreq1 and the negative direction is a direction in which voltage values of the RF signal output from the Y megahertz RF generator are negative compared to the average frequency yMHzavfreq1. As yet another example, a frequency parameter 310 is an example of the value thigh1. To illustrate, the frequency parameter 310 is a time period during which a frequency of the RF signal that is output from the Y megahertz RF generator after applying the methods described herein is high, such as within a predetermined high range of frequencies. As still another example, a frequency parameter 312 is an example of the value tlow1. To illustrate, the frequency parameter 312 is a time period during which a frequency of the RF signal that is output from the Y megahertz RF generator after applying the methods described herein is low, such as within a predetermined low range of frequencies.

Figure 3B:
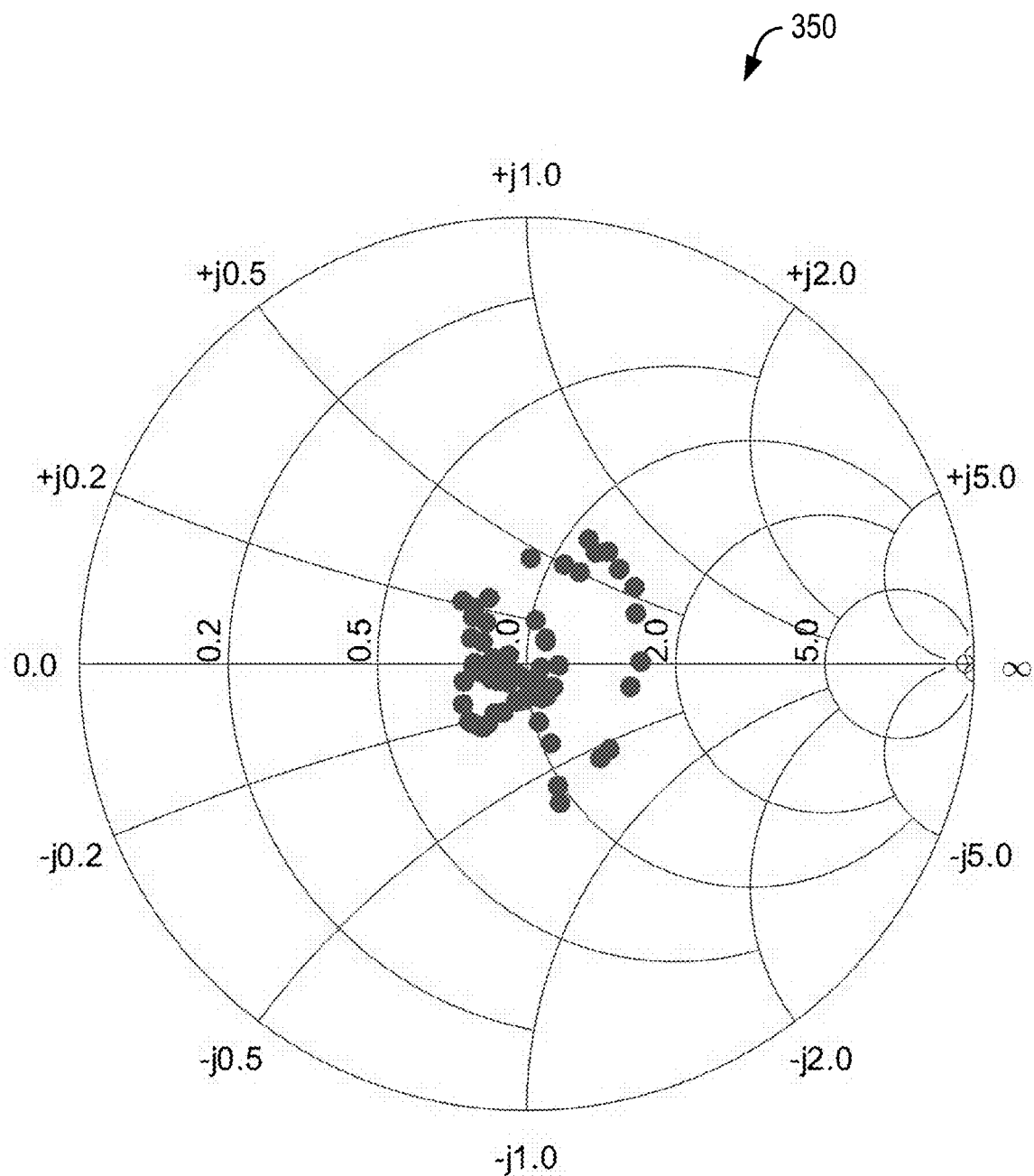
FIG. 3B is an embodiment of a Smith chart to illustrate values of a voltage reflection coefficient at an output of a Y MHz RF generator after applying the methods described herein.

FIG. 3B is a diagram of an embodiment of a Smith chart 350 to illustrate values of a voltage reflection coefficient at an output of a Y megahertz RF generator described herein after applying the methods described herein. For example, the Smith chart 350 illustrate values of the voltage reflection coefficient at the output O2 of the Y megahertz RF generator 114 of FIG. 1D-3 when the RF signal 190 (FIG. 1D-3) is generated by the Y megahertz RF generator 114. The Smith chart 350 is plotted for one cycle of operation of an X kilohertz RF generator such as the X kilohertz RF generator 112 (FIG. 1A), described herein. As illustrated in FIG. 3B, most of the values of the voltage reflection coefficient are closer to a center of the Smith chart 350 compared to values of the voltage reflection coefficient illustrated in the Smith chart 220 of FIG. 2E.

Figure 4A:
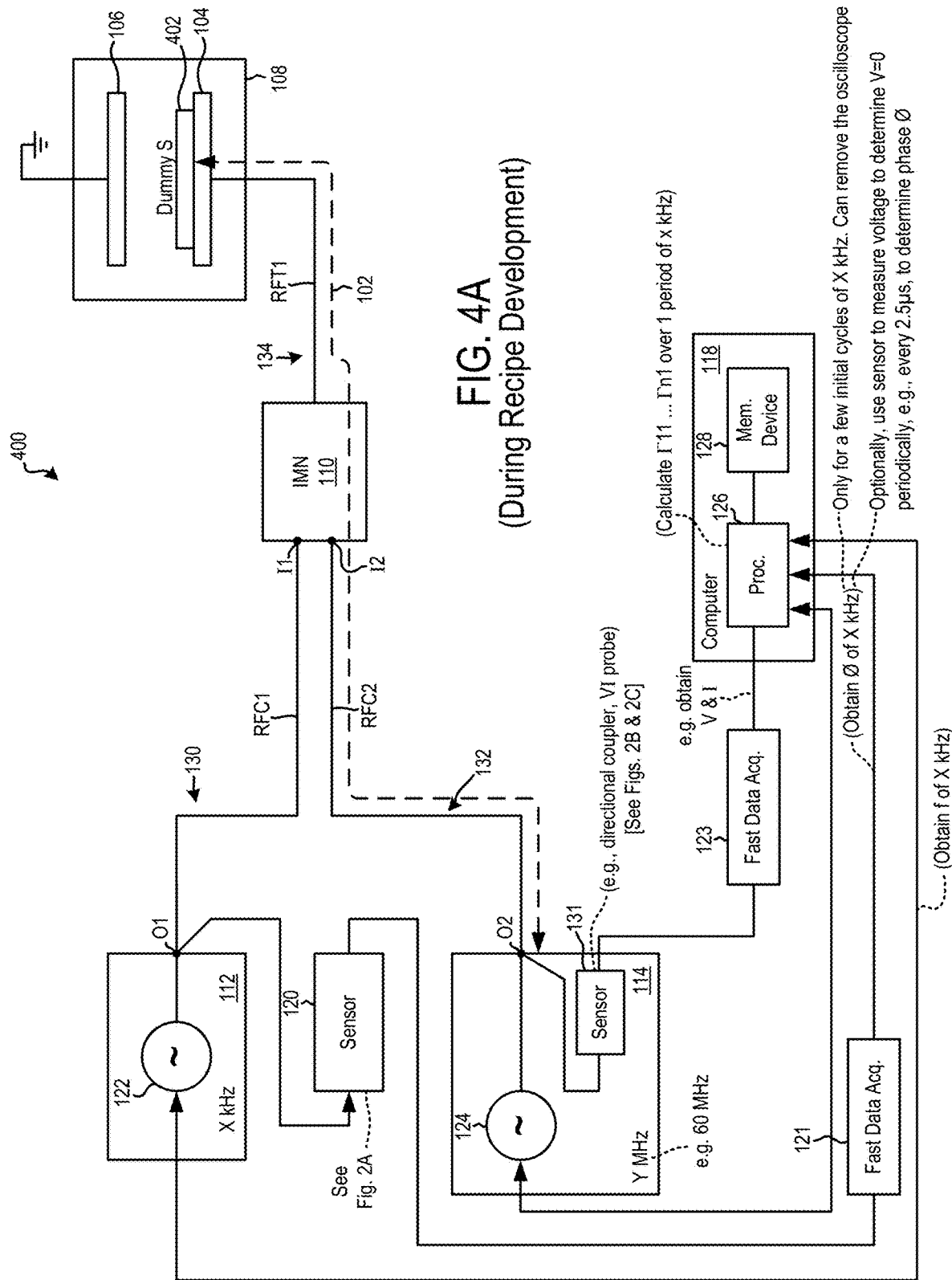
FIG. 4A is a diagram of an embodiment of a system to illustrate that the methods described above with respect to FIG. 1A are applicable to the system of FIG. 4A during recipe development instead of during processing of a substrate.

FIG. 4A is a diagram of an embodiment of a system 400, such as a plasma tool, to illustrate that the methods described above with respect to FIG. 1A are applicable to the system 400 during recipe development instead of during processing of the substrate S (FIG. 1A). The system 400 is the same in structure and function as the system 100 of FIG. 1A except that in the system 400, instead of processing the substrate S, a dummy substrate 402 is used for recipe development. For example, the dummy substrate 402 is placed on a top surface of the plasma excitation electrode 104 in the plasma chamber 108. The X kilohertz RF generator 112 generates the RF signal 130 and the Y megahertz RF generator 114 generates the RF signal 132. The RF signals 130 and 132 are modified by the impedance matching network 110 in the manner described above to generate the modified RF signal 134. The modified RF signal 134 is supplied to the lower electrode embedded in the plasma excitation electrode 104 to generate plasma in the plasma chamber 108 but there is no processing of the dummy substrate 402. For example, one or more process gases are not supplied to the plasma chamber 108 during recipe development.

The sensor 120 and the fast data acquisition device 121 measure a voltage at the output O1 to generate a voltage waveform, which is analyzed by the processor 126 in the manner described above with reference to FIG. 1A to determine a phase of the RF signal 130 supplied by the X kilohertz RF generator 112. Also, the sensor 131 and the fast data acquisition device 123 measure a complex voltage and current at the output O2, which is analyzed by the processor 126 and the manner described above with reference to FIG. 1A to determine the values Γ11, β21 through Γn1 of a voltage reflection coefficient for one cycle of operation of the X kilohertz RF generator 112.

FIG. 4B is a diagram of an embodiment of the table 130, which is generated by the processor 126 (FIG. 4A) during recipe development in the same manner in which the table 130 of FIG. 1B-1 is generated by the processor 126 during processing of the substrate S (FIG. 1A). The processor 126 determines the values Γ11, Γ21 through Γn1 of the voltage reflection coefficient for one cycle of operation of the X kilohertz RF generator 112 (FIG. 4A) during recipe development.

As described above, in one embodiment, instead of determining each value Γ11, Γ21 through Γn1 for one cycle of operation of the X kilohertz RF generator 112, each value Γ11, Γ21 through Γn1 of the voltage reflection coefficient is an average of values of the voltage reflection coefficient that are determined by the processor 126 from the complex voltage and current measured at the output O2 during a set of cycles of operation of the X kilohertz RF generator 112 during recipe development.

Figure 4C:
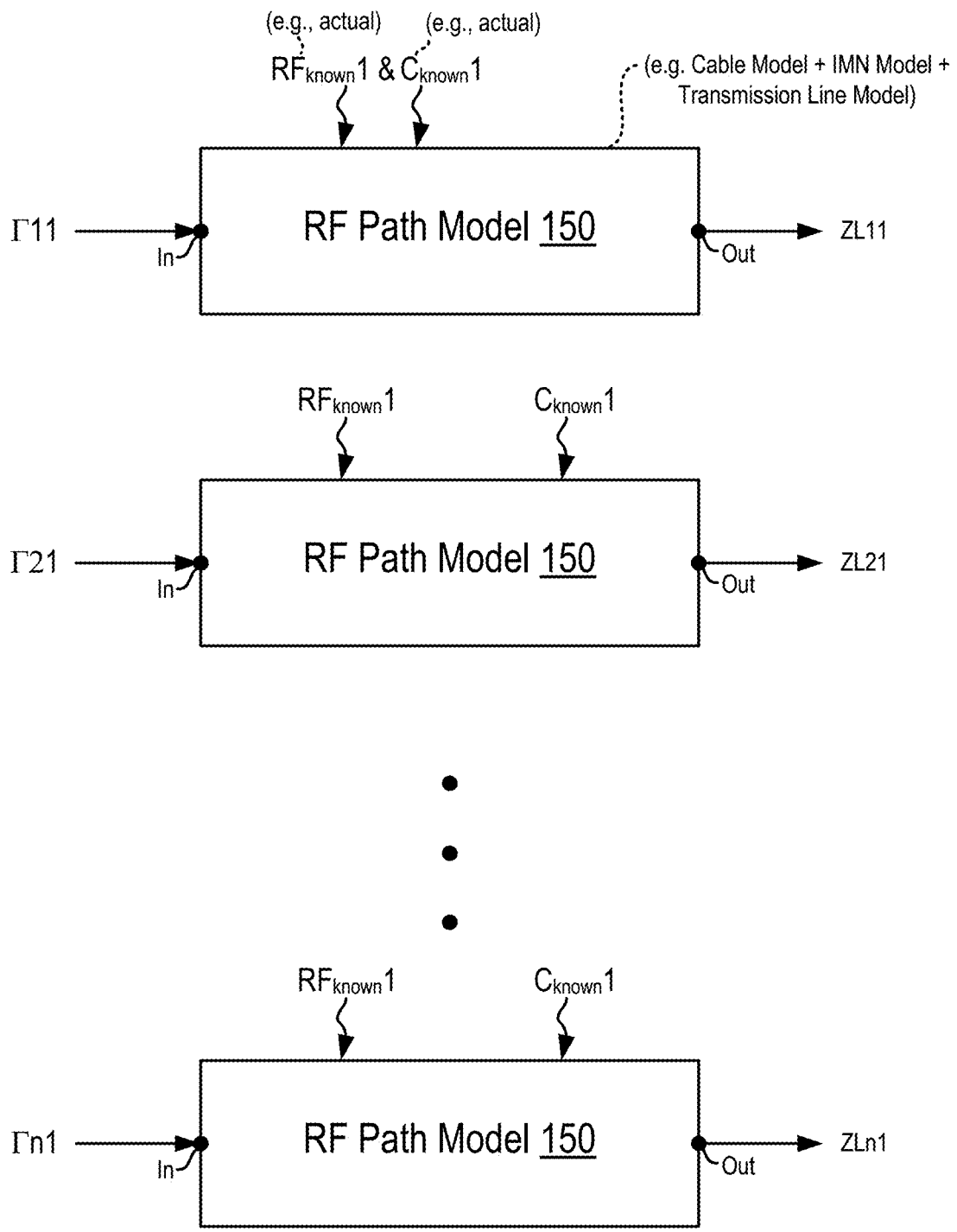
FIG. 4C is a diagram of an embodiment of the RF path model to illustrate generation of the load impedance values from the values of the voltage reflection coefficient for or during recipe development.

FIG. 4C is a diagram of an embodiment of the RF path model 150 to illustrate generation of the load impedance values ZL11 through ZLn1 from the values Γ11, Γ21 through Γn1 of the voltage reflection coefficient for or during recipe development. The load impedance values ZL11 through ZLn1 are generated by the processor 126 (FIG. 4A) in the same manner described above with respect to FIG. 1C from the values Γ11, Γ21 through Γn1 except that the load impedance values are generated during recipe development instead of during processing of the substrate S (FIG. 1A).

Figure 4D:
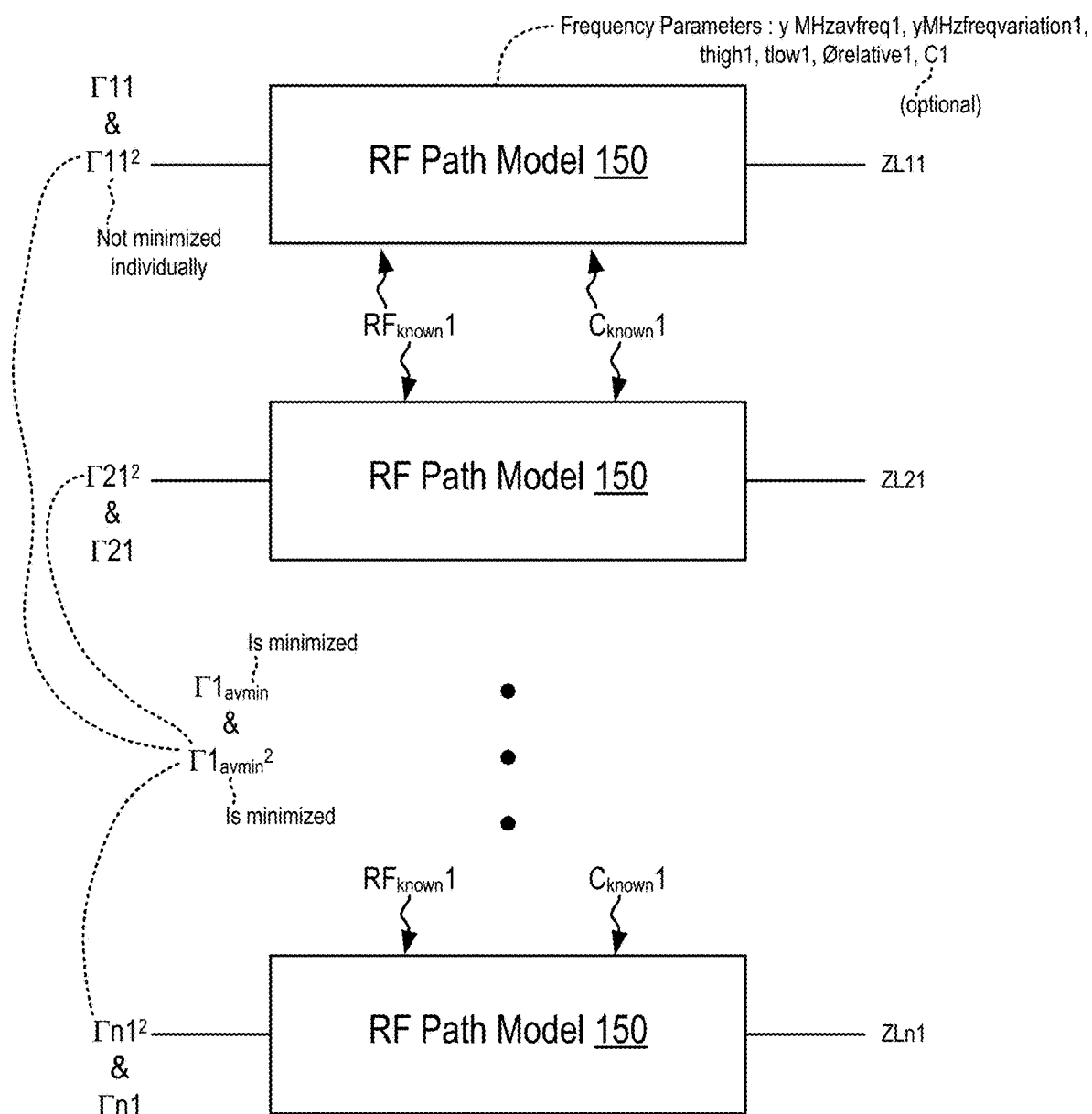
FIG. 4D is a diagram of an embodiment to illustrate a determination of the values of the operation parameters for or during recipe development.

FIG. 4D is a diagram of an embodiment to illustrate a determination of the values yMHzavfreq1, yMHzfreqvariation1, thigh1, tlow1, ϕrelative1, and C1 of the operation parameters for or during recipe development. The values yMHzavfreq1, yMHzfreqvariation1, thigh1, tlow1, ϕrelative1, and C1 of the operation parameters for or during recipe development are determined in the same manner as that described above with reference to FIG. 1D-1 for which the average power reflection coefficient in minimized.

In one embodiment, the processor 126 determines the values yMHzavfreq1, yMHzfreqvariation1, thigh1, tlow1, ϕrelative1, and C1 of the operation parameters for or during recipe development to minimize both the average power reflection coefficient and an average voltage reflection coefficient. For example, the processor 126 determines the values Γ1a through Γna of the voltage reflection coefficient and the values Γ1$a^2$ through Γn$a^2$ of the power reflection coefficient at the input of the RF path model 150 from the values ZL11 through ZLn1 of load impedance at the output of the RF path model 150 in the same manner as that described above with reference to FIG. 1D-1. Before determining the values $\Gamma 1a$ through $\Gamma na$ of the voltage reflection coefficient and the values $\Gamma 1a^2$ through $\Gamma na^2$ of the power reflection coefficient, the RF path model 150 is initialized by the processor 126 to have the capacitance Cknown1 and the radio frequency RFknown. The capacitance Cknown1 is a capacitance of a capacitor of the branch of the impedance matching network 110 between the input I2 of the impedance matching network and the output of the impedance matching network 110 and the radio frequency RFknown is a value at which the Y megahertz RF generator 114 is being operated during recipe development.

The processor 126 further calculates the average of the values $\Gamma 1a^2$ through $\Gamma na^2$ of the power reflection coefficient at the input of the RF path model 150 to generate the first average value $\Gamma$Aavmin$^2$ of the power reflection coefficient. Also, the processor 126 calculates the an average of the values $\Gamma 1a$ through $\Gamma na$ of the voltage reflection coefficient at the input of the RF path model 150 to generate a first average value $\Gamma$Aavmin of the voltage reflection coefficient. The processor 126 determines values, such as yMHzavfreqA, yMHzfreqvariationA, thighA, tlowA, $\phi$relativeA, and CA, of the operation parameters for which the first average values $\Gamma$Aavmin$^2$ and $\Gamma$Aavmin are calculated, where yMHzavfreqA is an average frequency of operation at which a Y megahertz RF generator (FIG. 4E) is to be operated during processing of a substrate, yMHzfreqvariationA is a variation in the average frequency, thighA is a high dwell time for which a power level or a voltage level of the Y megahertz RF generator is to remain at a high level, tlowA is a low dwell time for which a power level or a voltage level of the Y megahertz RF generator is to remain at a low level, $\phi$relativeA is a relative phase of an RF signal to be output by the Y megahertz RF generator compared to the phase of an RF signal to be output by an X kilohertz RF generator used to process the substrate, and CA is a total capacitance to be applied to a branch of an impedance matching network used to process the substrate. The branch of the impedance matching network is between an input of the impedance matching network that is coupled to the Y megahertz RF generator and an output of the impedance matching network.

Moreover, the processor 126 determines the values $\Gamma 11^2$ through $\Gamma n1^2$ of the power reflection coefficient and the values $\Gamma 11$ through $\Gamma n1$ of the voltage reflection coefficient at the input of the RF path model 150 from the values ZL11 through ZLn1 of load impedance at the output of the RF path model 150 in the same manner as that described above with reference to FIG. 1D-1. Before determining the values $\Gamma 11^2$ through $\Gamma n1^2$ of the power reflection coefficient and the values $\Gamma 11$ through $\Gamma n1$ of the voltage reflection coefficient, the RF path model 150 is initialized by the processor 126 to have the capacitance Cknown1 and the radio frequency RFknown.

The processor 126 further calculates the average of the values $\Gamma 11^2$ through $\Gamma n1^2$ of the power reflection coefficient to generate the second average value $\Gamma 1a$vmin$^2$ and also calculates an average of the values $\Gamma 11$ through $\Gamma n1$ of the voltage reflection coefficient to generate a second average value $\Gamma 1a$vmin of the voltage reflection coefficient at the input of the RF path model 150. The processor 126 determines values, such as yMHzavfreq1, yMHzfreqvariation1, thigh1, tlow1, $\phi$relative1, and C1, of the operation parameters for which the second average values $\Gamma 1a$vmin$^2$ and $\Gamma 1a$vmin are calculated, where yMHzavfreq1 is an average frequency of operation at which the Y megahertz RF generator is to be operated to process the substrate, yMHzfreqvariation1 is a variation in the average frequency, thigh1 is a high dwell time for which a power level or a voltage level of the Y megahertz RF generator is to remain at a high level, tlow1 is a low dwell time for which a power level or a voltage level of the Y megahertz RF generator is to remain at a low level, $\phi$relative1 is a relative phase of the RF signal to be output by the Y megahertz RF generator compared to the phase of the RF signal to be output by an X kilohertz RF generator to process the substrate, and C1 is a total capacitance to be applied to the branch of the impedance matching network used to process the substrate.

The processor 126 determines that the second average value $\Gamma 1a$vmin$^2$ of power reflection coefficient at the input of the RF path model 150 is less than or lower than the first average value $\Gamma$Aavmin$^2$ of power reflection coefficient at the input of the RF path model 150 and also determines that the second average value $\Gamma 1a$vmin of the voltage reflection coefficient at the input of the RF path model 150 is less than or lower than the first average value $\Gamma$Aavmin of voltage reflection coefficient at the input of the RF path model 150. In response to the determination, the processor 126 determines to apply the frequency parameters yMHzavfreq1, yMHzfreqvariation1, thigh1, tlow1, $\phi$relative1 instead of applying the yMHzavfreqA, yMHzfreqvariationA, thighA, tlowA, $\phi$relativeA to the Y megahertz RF generator and determines to apply the match network parameter C1 instead of applying the match network parameter CA to the impedance matching network used to process the substrate. The processor 126 stores the values, such as the values yMHzavfreq1, yMHzfreqvariation1, thigh1, tlow1, $\phi$relative1, and C1, of the operation parameters in the memory device 128 for later access by a processor 464 (FIG. 4E) from another memory device 468 (FIG. 4E).

FIG. 4E is a diagram of an embodiment of a system 450, such as a plasma tool, to illustrate application of the values yMHzavfreq1, yMHzfreqvariation1, thigh1, tlow1, $\phi$relative1, and C1 of the operation parameters that are determined during recipe development. The values yMHzavfreq1, yMHzfreqvariation1, thigh1, tlow1, $\phi$relative1, and C1 of the operation parameters are applied during processing of a substrate SU in a plasma chamber 458. As an example, the processing of the substrate SU is done by an entity that performs the recipe development and is performed after the recipe development. The system 450 includes an X kilohertz RF generator 452, a Y megahertz RF generator 454, the plasma chamber 458, an impedance matching network 456, a computer 463, a driver system 470, a motor system 472, a comparator 480, and a voltage sensor 482.

The X kilohertz RF generator 452 is similar in structure and function to that of the X kilohertz RF generator 112 (FIG. 4A) and includes an RF power supply 474. For example, the X kilohertz RF generator 452 is a 400 kHz RF generator. The RF power supply 474 is also similar and structure and function as the RF power supply 122 (FIG. 4A) of the X kilohertz RF generator 112. To illustrate, the RF power supply 474 is an RF oscillator.

Similarly, the Y megahertz RF generator 454 is similar in structure and function to that of the Y megahertz RF generator 114 (FIG. 4A) and includes an RF power supply 476. For example, the Y megahertz RF generator 454 is a 60 MHz RF generator. The RF power supply 476 is also similar and structure and function as the RF power supply 124 (FIG. 4A) of the Y megahertz RF generator 114. To illustrate, the RF power supply 476 is an RF oscillator.

The comparator 480 is similar in structure and function as that of the comparator 184 of FIG. 1D-3. For example, the comparator 480 may be implemented as a part of the processor 464 of the computer 463.

The impedance matching network 456 is also similar in structure and function as that of the impedance matching network 110 of FIG. 4A. For example, a branch of the impedance matching network 456 between an input I21 of the impedance matching network 456 and an output of the impedance matching network 456 has a combined impedance that is within a predetermined range from a combined impedance of the branch between the input I2 and the output of the impedance matching network 110. As an example, a combined impedance, as described herein, of a branch of an impedance matching network is a combination or a sum of impedances of all electrical components of the branch of the impedance matching network.

The motor system 472 is similar in structure and function as that of the motor system 186 (FIG. 1D-3) and the driver system 470 is also similar in structure and function as that of the driver system 188 (FIG. 1D-3). For example, the motor system for 72 includes one or more electric motors and the driver system for 70 includes a network of transistors.

Examples of a computer, such as the computer 463, are provided above. The computer 463 includes a processor 464 and a memory device 468. Examples of a processor, such as the processor 464, are provided above. Examples of a memory device, such as the memory device 468, are provided above. The processor 464 is coupled to the memory device 468 and is also coupled to the RF power supplies 474 and 476.

The plasma chamber 458 includes a plasma excitation electrode 462 and an upper electrode 460, which is coupled to a ground potential. The plasma excitation electrode 462 is similar in structure and function as that of the plasma excitation electrode 104 of the plasma chamber 108 (FIG. 4A). For example, a lower electrode of the plasma excitation electrode 462 is fabricated from aluminum or an alloy of aluminum. Also, the upper electrode 460 is similar in structure and function as that of the upper electrode 106 of FIG. 4A, and is placed above the plasma excitation electrode 462 to form a gap between the upper electrode 460 and the plasma excitation electrode 462. For example, the upper electrode 460 is fabricated from aluminum or an alloy of aluminum.

The RF power supply 474 of the X kilohertz RF generator 452 is coupled via an output O11 of the X kilohertz RF generator 452 and an RF cable RFC11 to an input I11 of the impedance matching network 456. In a similar manner, the RF power supply 476 of the Y megahertz RF generator 454 is coupled via an output O21 of the Y megahertz RF generator 454 and an RF cable RFC21 to the input I21 of the impedance matching network 456.

The output of the impedance matching network 456 is coupled via an RF transmission line RFT11 to the lower electrode of the plasma excitation electrode 462. The processor 464 is coupled to the driver system 470 and the comparator 480. The driver system 470 is coupled to the motor system 472, which is connected to the impedance matching network 456 via one or more connection components, examples of which are provided above. The voltage sensor 482 is coupled to the output O11 of the X kilohertz RF generator 452 and is coupled to the comparator 480.

The RF power supply 474 of the X kilohertz RF generator 452 generates an RF signal 484 for one or more cycles, and supplies the RF signal 484 via the output O11 and the RF cable RFC11 to the input I11 of the impedance matching network 456. The voltage sensor 482 measures a voltage of the RF signal 484 at the output O11 of the X kilohertz RF generator 452. The comparator 480 compares the voltage measured by the voltage sensor 482 with a value of zero to output comparison results and provides the comparison results to the processor 464. The comparison results provide whether the voltage is above or below zero or at zero, such as, for example, whether the voltage is positive or negative or zero. The processor 464 determines from the comparison results multiple times or instances at which the voltage is zero and is about to become positive from being negative. Based on the times or instances that are determined by the processor 464, a phase of the RF signal 484 is determined by the processor 464.

The computer 463 receives the values of the operation parameters from the computer 118 of FIG. 4A. For example, the values of the operation parameters are received by the processor 464 of the computer 463 via a computer network, such as the Internet or an intranet or a combination thereof, from the processor 126 of the computer 118. The processor 464 stores the values, such as the values yMHzavfreq1, yMHzfreqvariation1, thigh1, tlow1, φrelative1, and C1, of the operation parameters in the memory device 468 of the computer 463.

Moreover, the processor 464 provides the values yMHzavfreq1, yMHzfreqvariation1, thigh1, tlow1, φrelative1 of the frequency parameters to the RF power supply 476. The relative phase φrelative1 is determined by the processor 464 from the phase of the RF signal 484 that is determined during processing of the substrate SU. Upon receiving the frequency parameters, the RF power supply 476 generates an RF signal 486 having the values yMHzavfreq1, yMHzfreqvariation1, thigh1, tlow1, and φrelative1. For example, the RF signal 486 has an envelope or a peak-to-peak amplitude that is of a trapezoidal shape or a pulse shape or a square wave shape or a sinusoidal shape. The RF signal 486 is itself a sinusoidal signal or a substantially sinusoidal signal. The RF signal 486 is supplied by the RF power supply 476 via the output O21 and the RF cable RFC21 to the input I21 of the impedance matching network 456. The RF signal 486 is generated during the one or more cycles of the RF signal 484.

Moreover, the processor 464 generates an instruction signal and sends the instruction signal to the driver system 470. An example of the instruction signal is one that includes one or more amounts of current to be output by the driver system 470 to control the motor system 472 to achieve a combined capacitance of the branch between the input I21 and the output of the impedance matching network 456. Upon receiving the instruction signal, the driver system 470 generates one or more current signals and sends the current signals to the motor system 472.

The motor system 472 is operated according to the one or more current signals and controls one or more variable capacitors of the impedance matching network 456 to achieve the capacitance C1 of the impedance matching network 456. For example, a motor of the motor system 472 operates to rotate or move in a linear direction a plate of a capacitor in the impedance matching network 456 to change an area or distance between the plate and another plate of the capacitor to change a capacitance of the capacitor to achieve the capacitance C1 of the impedance matching network 456.

The impedance matching network 456, which has the capacitance C1, receives the RF signals 484 and 486, and processes the RF signals 484 and 486 in the manner described above with respect to the RF signals 130 and 132 (FIG. 4A) to output a modified RF signal 488. For example, the impedance matching network 456 matches an impedance of a load that is coupled to the output of impedance matching network 456 with that of a source that is coupled to the inputs I11 and I21 of the impedance matching network 456 to output the modified RF signal 488. An example of the load coupled to the output of the impedance matching network 456 includes the plasma chamber 458 and the RF transmission line RFT11. An example of the source coupled to the inputs I11 and I21 include the X kilohertz RF generator 452, the Y megahertz RF generator 454, and the RF cables RFC11 and RFC21.

The lower electrode of the plasma excitation electrode 462 receives the modified RF signal 488 via the RF transmission line RFT11 from the output of impedance matching network 456. In addition to receiving the modified RF signal 488, the one or more process gases are received by the plasma chamber 458 to strike or maintain plasma within the plasma chamber 458. The plasma facilitates processing of the substrate SU during one or more cycles of operation of the X kilohertz RF generator 452.

In one embodiment, the method described herein with reference to FIG. 4E are used to process many substrates within the plasma chamber 458 or are used for a different system that is similar in structure and function as the system 450.

In one embodiment, instead of an average frequency of a Y megahertz RF generator, a baseline frequency is used or determined. Examples of the baseline frequency include an average frequency and a median frequency.

In an embodiment, during processing of the substrate SU, the processor 126 continues to apply the frequency parameters determining during recipe development to a baseline frequency of the Y megahertz RF generator 454. For example, during processing of the substrate S, the values yMHzfreqvariation1, thigh1, tlow1, and ϕrelative1, are applied by the processor 126 to an average frequency of operation of the Y megahertz RF generator 454. To illustrate, the processor 126 modifies the average frequency of the Y MHz RF generator 454 during the processing of the substrate SU by the values yMHzfreqvariation1, thigh1, and tlow1 while achieving a relative phase of ϕrelative1 between the RF signal 486 generated by the Y MHz RF generator 454 and the RF signal 484 generated by the X MHz RF generator 452.

In the embodiment, the baseline frequency of the Y megahertz RF generator 454 is determined by the processor 464 by applying one of many methods. For example, a sensor, such as a complex voltage and current sensor, is coupled to the output O21 of the Y megahertz RF generator 454. The sensor is also coupled to the processor 464. The sensor that is coupled to the processor 464 measures a complex voltage and current, and provides the complex voltage and current to the processor 464. The processor 464 calculates or determines, from the complex voltage and current, a power-based parameter, such as an average power reflected at a fundamental operating frequency of the Y megahertz RF generator 454 towards the Y megahertz RF generator 454, an average power reflected towards the Y megahertz RF generator 454 at fundamental frequencies of the X kilohertz RF generator 452 and the Y megahertz RF generator 454 including sidebands, an average power reflected towards the Y megahertz RF generator 454 at the fundamental frequencies of the X kilohertz RF generator 452 and the Y megahertz RF generator 454 without the sidebands, an average power reflection coefficient, and an average power reflection coefficient and an average voltage reflection coefficient. The sidebands include harmonic frequencies associated with, e.g., generated from, based on, etc., the fundamental frequencies of the X kilohertz RF generator 452 and the Y megahertz RF generator 454. As an example, the processor 454 accesses a look-up table stored in the memory device 468 to determine the power-based parameter from the complex voltage and current measured by the sensor that is coupled to the processor 454.

Continuing with the embodiment, the processor 464 determines whether one or more values of the determined power-based parameter received from the sensor are within a pre-set range from a power-based parameter value stored in the memory device 468. Upon determining that the one or more values of the determined power-based parameter are not within the pre-set range from the power-based parameter value stored in the memory device 468, the processor 464 changes a frequency of operation of the Y megahertz RF generator 454. The processor 464 continues to the change the frequency of operation of the Y megahertz RF generator 454 until one or more values of the determined power-based parameter received from the sensor are within the pre-set range from the power-based parameter value stored in the memory device 468. The processor 464 determines an average of values of the frequency of operation of the Y megahertz RF generator 454 for which the one or more values of the determined power-based parameter received from the sensor are within the pre-set range from the power-based parameter value stored in the memory device 468 to determine the baseline frequency. As another example, instead of the average of the values of the frequency of operation of the Y megahertz RF generator 454, a median the values of the frequency of operation of the Y megahertz RF generator 454 is determined by the processor 468 to be the baseline frequency. The determination of the average frequency based on the power-based parameter allows for variations in the baseline frequency from one plasma tool to another, e.g., from an RF generator of one plasma tool to an RF generator of another plasma tool. An RF generator of a plasma tool operates at a different baseline frequency from an RF generator of another plasma tool. Applying the values yMHzfreqvariation1, thigh1, tlow1, and ϕrelative1 to the different baseline frequencies of the RF generators of the plasma tools allows for tool-to-tool variation in a baseline frequency.

Figure 5A:
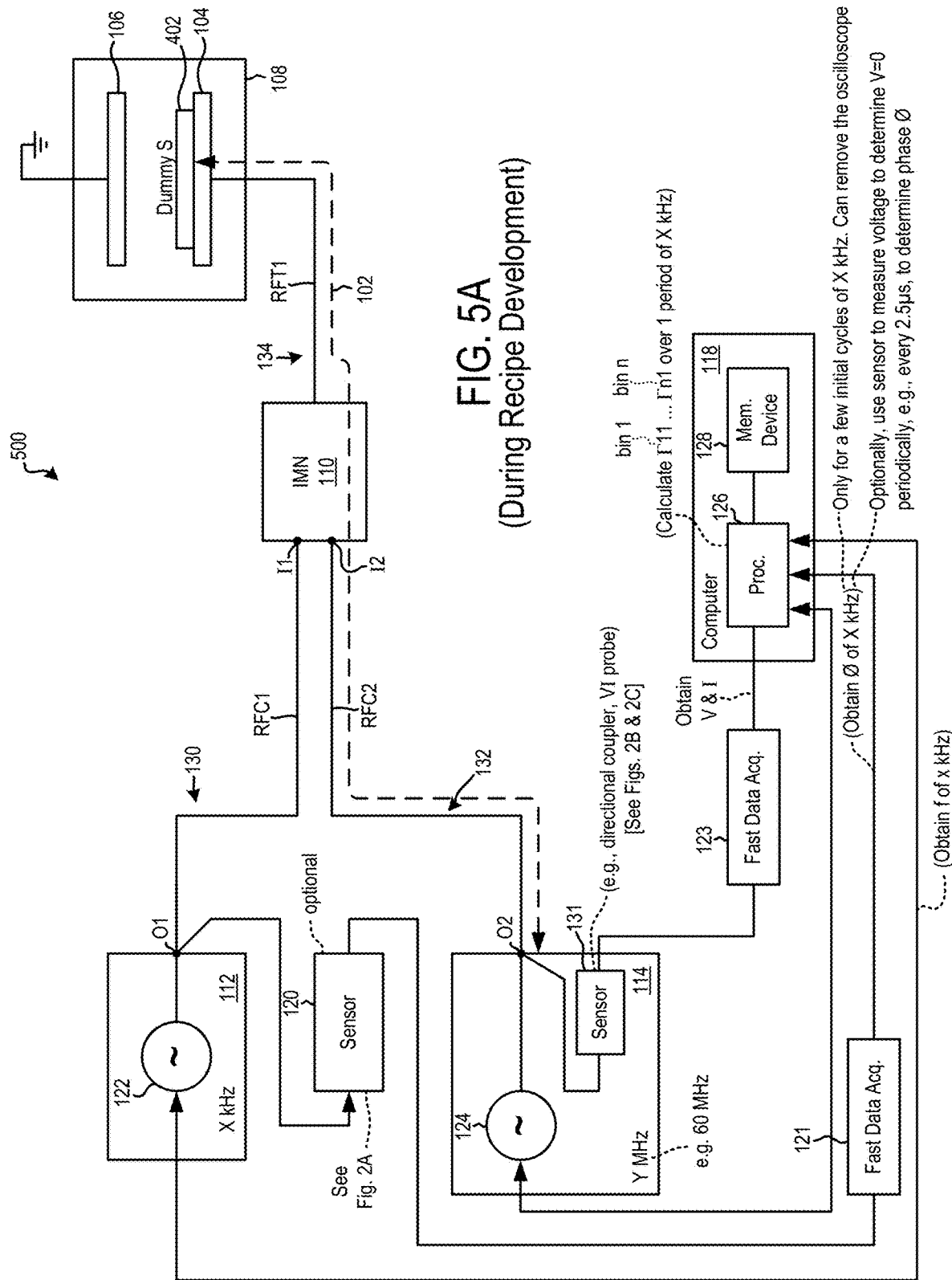
FIG. 5A is a diagram of an embodiment of a system to illustrate generation of the values of the voltage reflection coefficient by the processor during recipe development for each bin of a cycle of operation of the X kilohertz RF generator.

FIG. 5A is a diagram of an embodiment of a system 500, such as a plasma tool, to illustrate generation of the values Γ11, Γ21 through Γn1 of the voltage reflection coefficient by the processor 126 during recipe development. The system 500 is the same as the system 100 (FIG. 1A) or the system 400 (FIG. 4A) except that in the system 500, the values Γ11, Γ21 through Γn1 are determined for each bin or segment or portion of a time period of a cycle of the RF signal 130 that is output by the X kilohertz RF generator 112. The system 500 has the same structure and the same function as that of the system 100 or the system 400 except that in the system 500, the value Γ11 is generated from a value of complex voltage and current that is measured by the sensor 131 and the fast data acquisition device 123 during a first bin of the cycle of the RF signal 130, the value Γ12 is generated from a value of complex voltage and current that is measured by the sensor 131 and the fast data acquisition device 123 during a second bin of the cycle of the RF signal 130, and so on until the value Γn1 is generated from a value of complex voltage and current that is measured by the sensor 131 and the fast data acquisition device 123 during an nth bin of the cycle of the RF signal 130. The second bin is consecutive to the first bin and a third bin of the cycle of the RF signal 130 is consecutive to the second bin and so on until the nth bin is consecutive to an (n−1)th bin of the cycle of the RF signal 130. As an example, a time segment of the RF signal 142 (FIG. 1B-2) from 0 to 0.1 microseconds is an example of the first bin, a time segment of the RF signal 142 from 0.1 microseconds to 0.2 microseconds is an example of the second bin, a time segment of the RF signal 142 from 0.2 microseconds to 0.3 microseconds is an example of the third bin, and a time segment of the RF signal 142 from 0.(n−1) microseconds to 0.n microseconds is an example of the nth bin. The system 500 operates in the same manner as that of the system 100 or 400 except that in the system 500, the dummy substrate 402 is being used and the values Γ11, Γ21 through Γn1 are generated for the bins of the cycle of the RF signal 130. In the system 500, there is no processing of the substrate S.

FIG. 5B is a diagram of an embodiment of a table 510 that is generated by the processor 126 (FIG. 5A) for recipe development. The table 510 is the same as the table 130 of FIG. 1B-1 or FIG. 4B except that in the table each of the values Γ11, Γ21 through Γn1 corresponds to a different bin of the cycle of the RF signal 130 (FIG. 5A). For example, the value Γ11 is determined by the processor 126 from a value of complex voltage and current that is measured during a bin 1, e.g., the first bin, of the cycle of the RF signal 130 and the value Γ21 is determined by the processor 126 based on a value of complex voltage and current that is measured during a bin 2, e.g., the second bin, of the cycle of the RF signal 130. The table 510 is stored by the processor 126 in the memory device 128 (FIG. 5A).

In one embodiment, each value Γ11, Γ21 through Γn1 of the voltage reflection coefficient is an average that is calculated by the processor 126 for a corresponding bin over multiple cycles of the RF signal 130. For example, the value Γ11 is an average of multiple values of the voltage reflection coefficient, and each of the multiple values is determined by the processor 126 for bin 1 of each corresponding cycle of the RF signal 130. To illustrate, the value Γ11 is an average of a first value and a second value. The first value is calculated by the processor 126 based on a value of complex voltage and current that is measured by the sensor 131 and the fast data acquisition device 123 (FIG. 5A) during a bin 1 of a first cycle of the RF signal 130. Similarly, the second value is calculated by the processor 126 based on a value of complex voltage and current that is measured by the sensor 131 and the fast data acquisition device 123 during a bin 1 of a second cycle of the RF signal 130. The second cycle is consecutive to the first cycle. Each of the first and second cycles is divided into n number of bins from 1 through n by the processor 126.

Figure 5C:
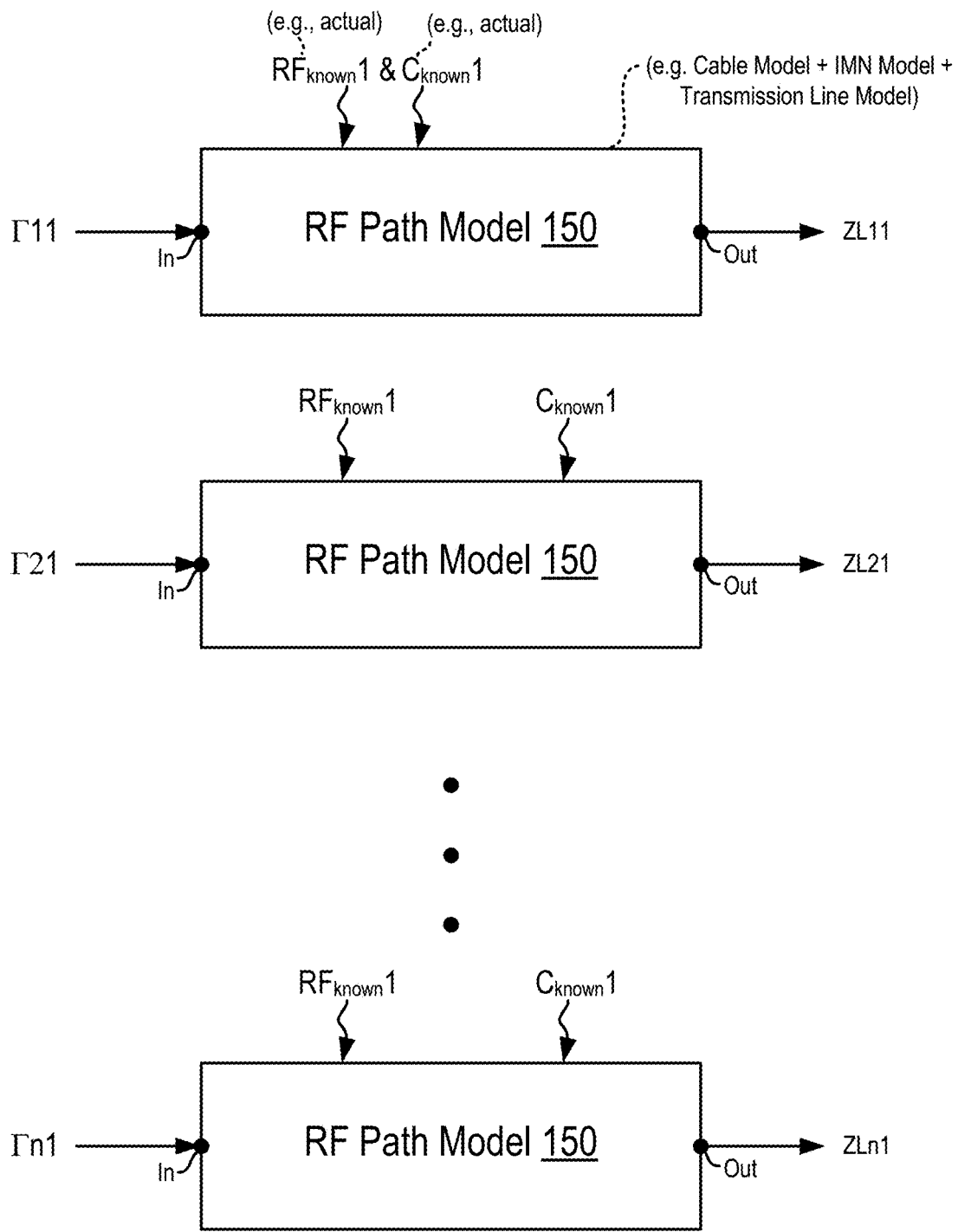
FIG. 5C is a diagram of an embodiment of the RF path model to illustrate generation of the load impedance values for each bin of the cycle of operation of the X kilohertz RF generator from the values of the voltage reflection coefficient during recipe development.

FIG. 5C is a diagram of an embodiment of the RF path model 150 to illustrate generation of the load impedance values ZL11 through ZLn1 for each bin of the cycle of the RF signal 130 (FIG. 5A) from the values Γ11, Γ21 through Γn1 of the voltage reflection coefficient during recipe development. For example, the load impedance value ZL11 for the bin 1 is determined by the processor 126 from the value Γ11, the load impedance value ZL21 for the bin 2 is determined by the processor 126 from the value Γ21, and so on until the load impedance value ZLn1 for the bin n is determined by the processor 126 from the value Γn1. It should be noted that the load impedance values ZL11 through ZLn1 for each bin of the cycle of the RF signal 130 are determined from the values Γ11, Γ21 through Γn1 of the voltage reflection coefficient in the same manner as that described above with respect to FIG. 1C.

In one embodiment, instead of the values Γ11, Γ21 through Γn1 of the voltage reflection coefficient, measured values of the complex voltage and current are applied by the processor 126 to determine the load impedance values ZL11 through ZLn1 for each bin of the cycle of the RF signal 130

Figure 5D:
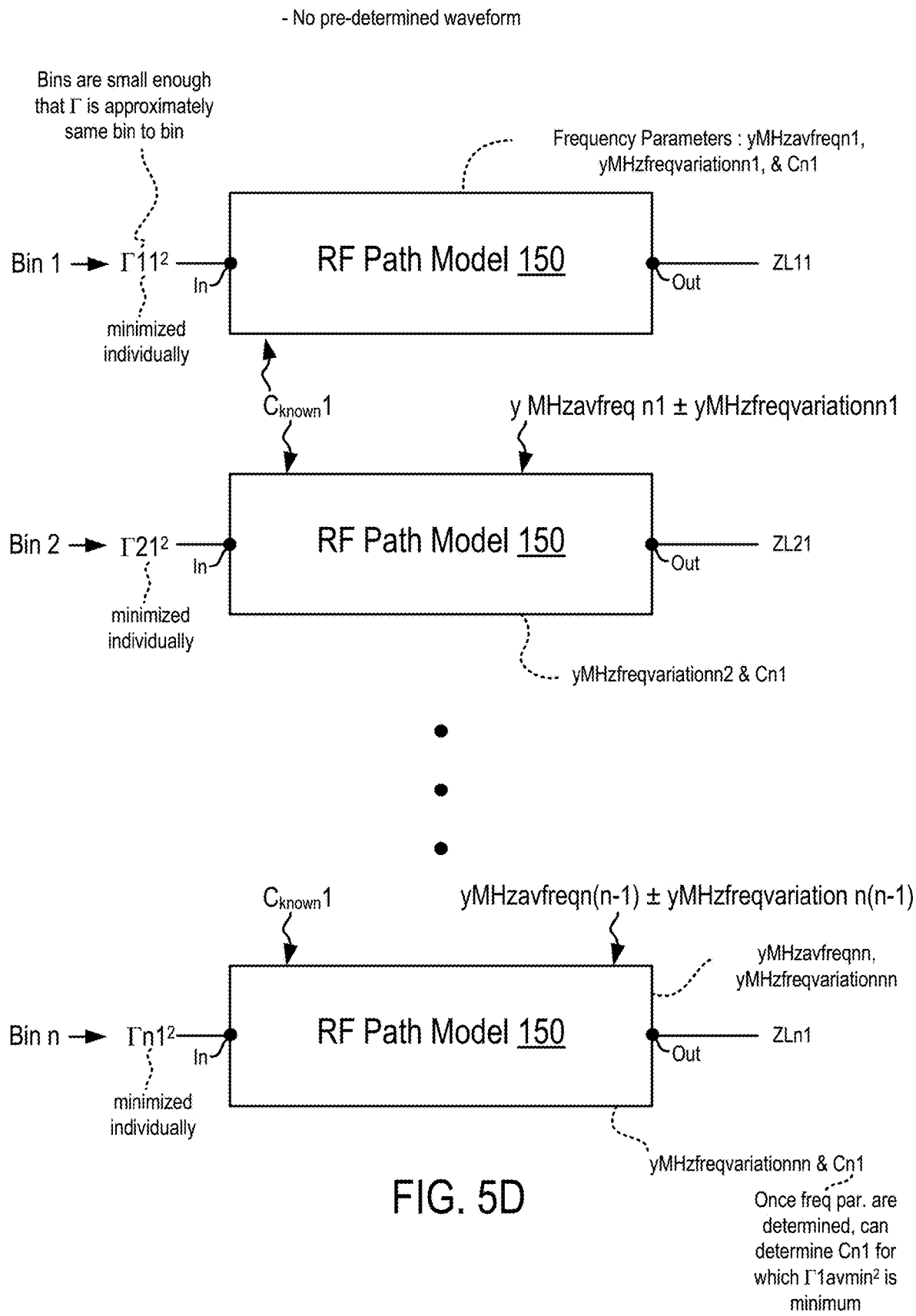
FIG. 5D is a diagram of an embodiment of the RF path model to illustrate a determination of values of the operation parameters for which values of the power reflection coefficient for the bins of the cycle of operation of the X kilohertz RF generator are minimized during recipe development.

FIG. 5D is a diagram of an embodiment of the RF path model 150 to illustrate a determination of values of the operation parameters for which values of the power reflection coefficient for the bins of the cycle 130 of the RF signal 130 (FIG. 5A) are minimized during recipe development. There is no predetermined waveform or the initial values of the operation parameters provided to the processor 126 (FIG. 5A). For example, the type of the periodic waveform of the RF signal 132 that is to be output from the Y MHz RF generator 114 is not provided to the RF path model 150.

Values of the operation parameters for each bin are determined by the processor 126 for which a value of the power reflection coefficient at the input of the RF path model 150 is minimized when a value of the load impedance is applied to the output of the RF path model 150. For example, the RF path model 150 is initialized to have the capacitance Cknown1 and the radio frequency RFknown. The capacitance Cknown1 is a capacitance of a capacitor of the circuit components of branch of the impedance matching network 110 between the input I2 and the output of the impedance matching network 110 and the radio frequency RFknown is a value at which the Y megahertz RF generator 114 is being operated during recipe development. The value ZL11 of the load impedance at the output of the RF path model 150 is backpropagated via the circuit elements of the RF path model 150 to determine the value ZL1a of load impedance at the input of the RF path model 150. The processor 126 calculates a directional sum of the value ZL11 and of values of impedance of the circuit elements of the RF path model 150 to determine the value ZL1a.

Continuing with the example, the processor 126 calculates the value $Γ1a^2$ of the power reflection coefficient at the input of the RF path model 150 from the value ZL1a of load impedance at the input of the RF path model 150. For example, the processor 126 accesses from the memory device 126 a correspondence, such as a mapping or a linking, between the value Γ1a of the voltage reflection coefficient and the value ZL1a of the load impedance to identify or determine the value Γ1a of the voltage reflection coefficient.

Continuing further with the example, the processor 126 calculates a square of the value Γ1a of the voltage reflection coefficient at the input of the RF path model 150 to determine the value $Γ1a^2$ of the power reflection coefficient at the input of the RF path model 150. The processor 126 determines values, such as yMHzavfreq1A and yMHzfreqvariation1A, and C1A of the operation parameters for which the value $Γ1a^2$ of the power reflection coefficient is calculated, where yMHzavfreq1A is an average frequency of operation at which the Y megahertz RF generator 454 (FIG. 5E) is to be operated during the bin 1 of a cycle of an RF signal output from an X KHz RF generator 452 (FIG. 5E), yMHzfreqvariation1A is a variation in the average frequency yMHzavfreq1A during the bin 1, and C1A is a total capacitance to be applied to a branch between the input I21 and the output of the impedance matching network 456 (FIG. 5E).

To illustrate the determination of the values, such as yMHzavfreq1A, yMHzfreqvariation1A, and C1A, of the operation parameters, the processor 126 provides the values of the operation parameters to the RF path model 150. By providing the values to the RF path model 150, the processor 126 makes the values available to the RF path model 150. Once the RF path model 150 has received the values of the operation parameters from the processor 126 to be characterized by the values, the processor 126 backpropagates the value ZL11 of the load impedance at the output of the RF path model 150 to determine the value Γ1a of the voltage reflection coefficient at the input of the RF path model 150. The processor 126 accesses the values of the operation parameters from the memory device 126 and makes the values available to, e.g., provides the values to, the RF path model 150 for which the value Γ1a of the voltage reflection coefficient is determined.

Continuing with the example, the value ZL11 of the load impedance at the output of the RF path model 150 is backpropagated by the processor 126 via the circuit elements of the RF path model 150 to determine the value ZL1x of load impedance at the input of the RF path model 150. The processor 126 calculates a directional sum of the value ZL11 and of values of impedance of the circuit elements of the RF path model to determine the value ZL1x.

Continuing with the example, the processor 126 calculates the value $\Gamma 11^2$ of the power reflection coefficient at the input of the RF path model 150 from the value ZL1x of load impedance at the input of the RF path model 150. For example, the processor 126 accesses from the memory device 126 a correspondence, such as a mapping or a linking, between the value Γ11 of the voltage reflection coefficient and the value ZL1x of the load impedance to identify or determine the value Γ11 of the voltage reflection coefficient.

Continuing further with the example, the processor 126 calculates a square of the value Γ11 of the voltage reflection coefficient at the input of the RF path model 150 to determine the value $\Gamma 11^2$ of the power reflection coefficient at the input of the RF path model 150. The processor 126 determines values, such as yMHzavfreqn1, yMHzfreqvariationn1, and Cn1, of the operation parameters for which the value $\Gamma 11^2$ of the power reflection coefficient is calculated, where yMHzavfreqn1 is an average frequency of operation at which the Y megahertz RF generator 454 (FIG. 5E) is to be operated, yMHzfreqvariationn1 is a variation in the average frequency, and Cn1 is a total capacitance to be applied to the branch between the input I21 and the output of the impedance matching network 456 (FIG. 5E).

To illustrate the determination of the values, such as yMHzavfreqn1, yMHzfreqvariationn1, and Cn1, of the operation parameters, the processor 126 provides the values of the operation parameters to the RF path model 150. By providing the values to the RF path model 150, the processor 126 makes the values available to the RF path model 150. Once the RF path model 150 has received the values of the operation parameters from the processor 126 to be characterized by the values, the processor 126 backpropagates the value ZL11 of the load impedance at the output of the RF path model 150 to determine the value Γ11 of the voltage reflection coefficient at the input of the RF path model 150. The processor 126 accesses the values of the operation parameters from the memory device 126 and makes the values available to, e.g., provides the values to, the RF path model 150 for which the value Γ11 of the voltage reflection coefficient is determined.

The processor 126 determines that the value $\Gamma 11^2$ of the power reflection coefficient at the input of the RF path model 150 is less than or lower than the value $\Gamma 1a^2$ of the power reflection coefficient at the input of the RF path model 150 for the bin 1. In response to the determination, the processor 126 determines to apply the frequency parameters yMHzavfreqn1 and yMHzfreqvariationn1 instead of applying the frequency parameters yMHzavfreq1A and yMHzfreqvariation1A to the Y megahertz RF generator 454 (FIG. 5E) and determines to apply the match network parameter Cn1 instead of applying the match network parameter C1A to the impedance matching network 456 (FIG. 5E).

In a similar manner, values yMHzfreqvariationn2, and Cn1 of the operation parameters are determined by the processor 126 for the bin 2 of the RF signal 484 (FIG. 5E) to be generated by the X kilohertz RF generator 452 (FIG. 5E) except that for the bin 2, the processor 126 determines the value yMHzavfreqn2 to be a directional sum of the value yMHzavfreqn1 and the value yMHzfreqvariationn1, which are calculated for the bin 1. Also, for the bin 2, the processor 126 initiates the RF path model 150 to be at the value yMHzavfreqn2. Also, similarly, values yMHzavfreqnn, yMHzfreqvariationnn, and Cn1 are determined by the processor 126 for bin n of the RF signal 484 to be generated by the X kilohertz RF generator 452 (FIG. 5E). The processor 126 stores the values, such as the values yMHzavfreqn1, yMHzfreqvariationn1, yMHzfreqvariationn2, yMHzfreqvariationnn, and Cn1, of the operation parameters for the bins 1 through n in the memory device 128.

In one embodiment, the value Cn1 of the match network parameter of the RF path model 150 is determined after determining the values of the frequency parameters of the RF path model 150 for the bins 1 through n. For example, the processor 126 determines the values yMHzavfreqn1, yMHzfreqvariationn1, yMHzfreqvariationn2, and so on until the value yMHzfreqvariationnn in a similar manner to that described above with reference to FIG. 5D except that the processor 126 does not determine the values Cn1 and C1A. After the values yMHzavfreqn1, yMHzfreqvariationn1, yMHzfreqvariationn2, and so on until the value yMHzfreqvariationnn are determined, the processor 126 determines the value Cn1 for which an average of the values of the power reflection coefficient at the input of the RF path model 150 is minimum. To illustrate, the processor 126 calculates a first average of the values $\Gamma 1a^2$, $\Gamma 2a^2$, and $\Gamma na^2$ of the power reflection coefficient at the input of the RF path model 150 and determines that the RF path model 150 has the value C1A to achieve the first average, calculates a second average value $\Gamma 1a v \min^2$ of the values $\Gamma 11^2$, $\Gamma 21^2$, and $\Gamma n1^2$ of the power reflection coefficient at the input of the RF path model 150 and determines that the RF path model 150 has the value Cn1 to achieve the second average value $\Gamma 1a v \min^2$. The processor 126 further determines that the second average value $\Gamma 1a v \min^2$ is lower than the first average. Upon determining that the second average value $\Gamma 1a v \min^2$ is lower than the first average, the processor 126 determines that the value Cn1 of the match network parameter for which the second average value $\Gamma 1a v \min^2$ is calculated is to be applied to the impedance matching network 456 of FIG. 5E. The processor 126 stores the values yMHzavfreqn1, yMHzfreqvariationn1, yMHzfreqvariationn2, and yMHzfreqvariationnn, and the value Cn1 of the operation parameters in the memory device 128 (FIG. 5A).

FIG. 5E is a diagram of an embodiment of the system 450 to illustrate use of the values yMHzavfreqn1, yMHzfreqvariationn1, yMHzfreqvariationn2, and yMHzfreqvariationnn, and the value Cn1 during processing of the substrate SU. In the system 450, the computer 463 receives the values of the operation parameters from the computer 118 of FIG. 5A. For example, the values yMHzavfreqn1, yMHzfreqvariationn1, yMHzfreqvariationn2, and yMHzfreqvariationnn, and the value Cn1 of the operation parameters are received by the processor 464 of the computer 463 via the computer network from the processor 126 of the computer 118. The processor 464 stores the values, such as the values yMHzavfreqn1, yMHzfreqvariationn1, yMHzfreqvariationn2, and yMHzfreqvariationnn, and the value Cn1, of the operation parameters in the memory device 468 of the computer 463.

While processing the substrate SU in the plasma chamber 458, the processor 464 in response to determining that the phase of the RF signal 484 is such that the RF signal 484 has crossed a zero crossing to achieve a positive voltage or power value from a negative voltage or power value, sends the values yMHzavfreqn1 and yMHzfreqvariationn1 of the frequency parameters for the bin 1 of the RF signal 484 to the RF power supply 476. Upon receiving the values yMHzavfreqn1 and yMHzfreqvariationn1, the RF power supply 476 generates an RF signal 550 having a frequency that is a directional sum of the values yMHzavfreqn1 and yMHzfreqvariationn1 during a time period of the bin 1 of a first cycle of the RF signal 484.

The processor 464 determines that a time period for the bin 2 of the first cycle of the RF signal 484 is about to start. Upon determining so, the processor 464 accesses the value yMHzfreqvariationn2 from the memory device 468 and provides the value yMHzfreqvariationn2 to the RF power supply 476. During the time period of the bin 2 of the first cycle of the RF signal 484, the RF power supply 476 outputs the RF signal 550 having a directional sum of an average value of the frequency parameter and the value yMHzfreqvariationn2 The average value of the frequency parameter for the bin 2 of the RF signal 484 is a directional sum of the values yMHzavfreqn1 and yMHzfreqvariationn1. In a similar manner, the processor 464 provides the remaining values of the frequency parameters for the remaining bins from 3 through n to the RF power supply 476 during remaining bins of the first cycle of the RF signal 484 generated by the X kilohertz RF generator 452 to output the RF signal 550.

During following cycles of RF signal 484, the frequency parameters for the bins 1 through n of each of the following cycles are the same as that during bins 1 through n of the first cycle. For example, the RF signal 550 has the values yMHzavfreqn1 and yMHzfreqvariationn1 during the bin 1 of a second cycle of the RF signal 484. The RF signal 550 has a directional sum of an average value of the frequency parameter and the value yMHzfreqvariationn2 during the bin 2 of the second cycle of the RF signal 484. The average value of the frequency parameter for the bin 2 of the second cycle of the RF signal 484 is a directional sum of the values yMHzavfreqn1 and yMHzfreqvariationn1.

Moreover, the processor 464 controls a combined capacitance of the branch between the input I21 and the output of the impedance matching network 456 by controlling the motor system 472 in the same manner as that is described above with reference to FIG. 4E. For example, the processor 464 controls one or more capacitors of the impedance matching network 456 via the driver system 470 and the motor system 472 to achieve the capacitance Cn1 of the branch between the input I21 and the output of the impedance matching network 456 during processing of the substrate SU.

The RF power supply 476 supplies the RF signal 550 via the output O21 of the Y megahertz RF generator 454 and the RF cable RFC 21 to the input I21 of the impedance matching network 456 having the combined capacitance Cn1. Upon receiving the RF signals 484 and 550, the impedance matching network 456 matches an impedance of the load that is coupled to the output of impedance matching network 456 with that of the source that is coupled to the inputs I11 and I21 of the impedance matching network 456 to output a modified RF signal 552 at the output of the impedance matching network 456. Once the lower electrode of the plasma chamber 458 receives the modified RF signal 552 and the one or more process gases are supplied to the gap between the upper electrode 460 and the lower electrode of the plasma excitation electrode 462 of the plasma chamber 458, plasma is stricken or maintained within the plasma chamber 458 to process the substrate SU within the plasma chamber 458.

In one embodiment, a directional sum, as used herein, is a vector sum.

In one embodiment, the method described herein with reference to FIG. 5E are used to process many substrates within the plasma chamber 458 or are used for a different system that is similar in structure and function as the system 450.

It should be noted that in an embodiment, instead of applying an RF signal to the lower electrode of the plasma excitation electrode 462 and coupling the upper electrode 460 to the ground potential, the RF signal is applied to the upper electrode 460 and the lower electrode of the plasma excitation electrode 462 is coupled to the ground potential.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A tuning method comprising:
accessing, for a first set of one or more cycles of operation of a first radio frequency generator, a plurality of reflection parameter values associated with a second radio frequency generator;
calculating a plurality of load impedance parameter values from the plurality of reflection parameter values by applying the plurality of reflection parameter values to a computer-based model of at least a portion of a radio frequency path, wherein the radio frequency path is between the second radio frequency generator and an electrode of a plasma chamber;
receiving a plurality of frequency modulation parameters of a radio frequency signal to be generated by the second radio frequency generator;
determining values of the plurality of frequency modulation parameters by applying the plurality of load impedance parameter values to the computer-based model, wherein the values of the plurality of frequency modulation parameters are determined to minimize a reflection coefficient parameter at an input of the computer-based model; and
controlling the second radio frequency generator according to the values of the plurality of frequency modulation parameters during a second set of one or more cycles of operation of the first radio frequency generator.

2. The method of claim 1, wherein said accessing the plurality of reflection parameter values, said calculating the plurality of load impedance parameter values, said determining the values of the frequency modulation parameters, and said controlling the second radio frequency generator are executed during processing of a substrate in the plasma chamber.

3. The method of claim 1, wherein the plurality of reflection parameter values include a plurality of voltage reflection coefficient values, and wherein the reflection coefficient parameter is an average power reflection coefficient.

4. The method of claim 1, wherein the second set of one or more cycles of operation is subsequent to the first set of one or more cycles of operation.

5. The method of claim 1, wherein the first set includes two or more cycles of operation of the first radio frequency generator, and wherein each of the plurality of reflection parameter values is an average of multiple reflection coefficient values that are computed over the two or more cycles of the first set.

6. The method of claim 1, further comprising:
repeating said accessing the plurality of reflection parameter values, said calculating the plurality of load impedance parameter values, and said determining the values of the plurality of frequency modulation parameters for a third set of one or more cycles of operation of the first radio frequency generator; and
repeating said controlling the second radio frequency generator during a fourth set of one or more cycles of operation of the first radio frequency generator,
wherein the third set is subsequent to the second set and the fourth set is subsequent to the third set.

7. The method of claim 1, wherein the plurality of reflection parameter values include a plurality of values of complex voltage and current.

8. The method of claim 1, wherein the computer-based model includes a plurality of circuit elements, wherein two adjacent ones of the plurality of circuit elements are coupled to each other via a connection, and wherein the computer-based model has substantially the same impedance as that of the radio frequency path.

9. The method of claim 1, wherein the computer-based model includes a plurality of circuit elements, wherein two adjacent ones of the plurality of circuit elements are coupled to each other via a connection, and wherein the plurality of circuit elements represent a plurality of circuit components of the radio frequency path and are connected in the same manner as that of the plurality of circuit components of the radio frequency path.

10. The method of claim 1, wherein the radio frequency path includes:
a radio frequency cable that couples the second radio frequency generator with a branch of a match network, the branch,
a radio frequency transmission line that couples the match network with the plasma chamber, and
an electrode of the plasma chamber.

11. The method of claim 1, further comprising determining a capacitance for a match network by applying the plurality of load impedance parameter values to the computer-based model, wherein the match network is coupled between the second radio frequency generator and the plasma chamber and between the first radio frequency generator and the plasma chamber.

12. The method of claim 1, wherein said applying the plurality of load impedance parameter values to the computer-based model comprises:
backpropagating the plurality of load impedance parameter values from an output of the computer-based model via the computer-based model to facilitate calculation of a first plurality of reflection parameter input values at the input of the computer-based model, wherein the first plurality of reflection parameter input values are determined when amounts of the plurality of frequency modulation parameters are available to the computer-based model;
calculating a first average of the first plurality of reflection parameter input values;
backpropagating the plurality of load impedance parameter values from the output of the computer-based model via the computer-based model to facilitate calculation of a second plurality of reflection parameter input values at the input of the computer-based model, wherein the second plurality of reflection parameter input values are determined when the values of the plurality of frequency modulation parameters are available to the computer-based model;
calculating a second average of the second plurality of reflection parameter input values; and
determining whether the second average is lower than the first average.

13. The method of claim 1, wherein the plurality of frequency modulation parameters that are received describe a periodic function associated with one of the one or more cycles of operation of the first radio frequency generator.

14. The method of claim 13, wherein the periodic function is one of a trapezoidal function, a sinusoidal function, a pulsed function, and a sawtooth function.

15. A tuning method comprising:
during recipe development,
accessing, for a set of one or more cycles of operation of a first radio frequency generator, a plurality of reflection parameter values associated with a second radio frequency generator;
calculating a plurality of load impedance parameter values from the plurality of reflection parameter values by applying the plurality of reflection parameter values to a computer-based model of at least a portion of a radio frequency path, wherein the radio frequency path is between the second radio frequency generator and an electrode of a plasma chamber;
receiving a plurality of frequency modulation parameters of a radio frequency signal to be generated by the second radio frequency generator;

determining values of the plurality of frequency modulation parameters by applying the plurality of load impedance parameter values to the computer-based model, wherein the values of the plurality of frequency modulation parameters are determined to minimize one or more reflection coefficient parameters at an input of the computer-based model;

during processing of a substrate within another plasma chamber, controlling a third radio frequency generator according to the values of the plurality of frequency modulation parameters determined during the recipe development, wherein said controlling the third radio frequency generator is performed during a set of one or more cycles of operation of a fourth radio frequency generator.

16. The method of claim 15, wherein the one or more reflection coefficient parameters that are minimized during the recipe development include an average power reflection coefficient, and wherein the plurality of reflection parameter values include a plurality of values of a voltage reflection coefficient.

17. The method of claim 15, wherein the third radio frequency generator is designated to have the same frequency of operation as that of the second radio frequency generator and the fourth radio frequency generator is designated to have the same frequency of operation as that of the first radio frequency generator.

18. The method of claim 15, wherein the set of one or more cycles of operation of the first radio frequency generator includes two or more cycles of operation of the first radio frequency generator, and wherein each of the plurality of reflection parameter values is an average of multiple reflection coefficient values that are determined over the two or more cycles of operation of the first radio frequency generator.

19. The method of claim 15, wherein the plurality of reflection parameter values include a plurality of values of complex voltage and current.

20. The method of claim 15, wherein the plurality of frequency modulation parameters define a trapezoidal function, or a sinusoidal function, or a rectangular function, or a triangular function.

21. The method of claim 15, further comprising determining a capacitance for a match network by applying the plurality of load impedance parameter values to the computer-based model, wherein the match network is coupled between the third radio frequency generator and the other plasma chamber and between the fourth radio frequency generator and the other plasma chamber.

22. The method of claim 15, wherein said applying the plurality of load impedance parameter values to the computer-based model comprises:

backpropagating the plurality of load impedance parameter values from an output of the computer-based model via the computer-based model to calculate a first plurality of reflection parameter input values at the input of the computer-based model, wherein the first plurality of reflection parameter input values are determined when amounts of the plurality of frequency modulation parameters are available to the computer-based model;

calculating a first average of the first plurality of reflection parameter input values;

backpropagating the plurality of load impedance parameter values from the output of the computer-based model via the computer-based model to calculate a second plurality of reflection parameter input values at the input of the computer-based model, wherein the second plurality of reflection parameter input values are determined when the values of the plurality of frequency modulation parameters are available to the computer-based model;

calculating a second average of the second plurality of parameter input values; and determining that the second average is lower than the first average.

23. A tuning method comprising:

during recipe development, accessing, for a set of one or more cycles of operation of a first radio frequency generator, a plurality of reflection parameter values associated with a second radio frequency generator;

calculating a plurality of load impedance parameter values from the plurality of reflection parameter values by applying the plurality of reflection parameter values to a computer-based model of at least a portion of a radio frequency path between the second radio frequency generator and an electrode of a plasma chamber;

receiving a plurality of frequency modulation parameters of a radio frequency signal to be generated by the second radio frequency generator, wherein the plurality of frequency modulation parameters include a frequency variation of the radio frequency signal;

determining values of the plurality of frequency modulation parameters by applying the plurality of load impedance parameter values to the computer-based model, wherein the values of the plurality of frequency modulation parameters are determined to minimize one or more reflection coefficient parameters at an input of the computer-based model;

during processing of a substrate within another plasma chamber, controlling a third radio frequency generator according to the values of the plurality of frequency modulation parameters determined during the recipe development, wherein said controlling the third radio frequency generator includes applying the values of the plurality of frequency modulation parameters to a baseline frequency of operation of the third radio frequency generator.

24. The method of claim 23, wherein the plurality of frequency modulation parameters define a trapezoidal function, or a sinusoidal function, or a rectangular function, or a triangular function.

25. The method of claim 23, wherein the one or more reflection coefficient parameters that are minimized during the recipe development include an average power reflection coefficient, and wherein the plurality of reflection parameter values include a plurality of values of a voltage reflection coefficient.

26. The method of claim 23, wherein the baseline frequency is used to minimize a power-based parameter associated with the third radio frequency generator.

27. A tuning method comprising:

during recipe development, accessing, for a set of one or more cycles of operation of a first radio frequency generator, a plurality of reflection parameter values associated with a second radio frequency generator, wherein each of the plurality of reflection parameter values corresponds to a bin of each of the one or more cycles of operation of the first radio frequency generator;

calculating a plurality of load impedance parameter values from the plurality of reflection parameter values by applying the plurality of reflection parameter values to a computer-based model of at least a portion of a radio frequency path, wherein the radio frequency path is between the second radio frequency generator and an electrode of a plasma chamber;

determining values of a plurality of frequency modulation parameters by applying the plurality of load impedance parameter values to the computer-based model, wherein the values of the plurality of frequency modulation parameters are determined to minimize a plurality of values of a reflection coefficient parameter at an input of the computer-based model for each of the bins;

during processing of a substrate within another plasma chamber, controlling a third radio frequency generator according to the values of the plurality of frequency modulation parameters determined during the recipe development, wherein said controlling the third frequency generator is performed during a set of one or more cycles of operation of a fourth radio frequency generator.

28. The method of claim 27, wherein the reflection coefficient parameter includes a power reflection coefficient parameter.

29. The method of claim 27, wherein the set of one or more cycles of operation of the first radio frequency generator includes two or more cycles of operation of the first radio frequency generator, and wherein each of the plurality of reflection parameter values is an average of multiple reflection coefficient values that are determined over the two or more cycles of operation of the first radio frequency generator.

30. The method of claim 27, wherein the plurality of frequency modulation parameters include an average frequency of a radio frequency signal to be output by the third radio frequency generator and a frequency variation of the radio frequency signal to be output by the third radio frequency generator, and wherein the frequency variation is for each bin of a radio frequency signal to be generated by the fourth radio frequency generator.

31. The method of claim 27, wherein the plurality of load impedance parameter values are applied to the computer-based model to determine a capacitance for a match network, and wherein the match network is coupled between the third radio frequency generator and the other plasma chamber and between the fourth radio frequency generator and the other plasma chamber.

32. The method of claim 27, wherein said applying the plurality of load impedance parameter values to the computer-based model comprises:

backpropagating a first one of the plurality of load impedance parameter values from an output of the computer-based model via the computer-based model to facilitate calculation of a first reflection parameter input value at the input of the computer-based model, wherein the first reflection parameter input value is determined when amounts of the plurality of frequency modulation parameters are available to the computer-based model;

backpropagating the first one of the plurality of load impedance parameter values from the output of the computer-based model via the computer-based model to calculate a second reflection parameter input value at the input of the computer-based model, wherein the second reflection parameter input value is determined when the values of the plurality of frequency modulation parameters are available to the computer-based model determining whether the second reflection parameter input value is lower than the first reflection parameter input value.

* * * * *